United States Patent
Sather et al.

(12) 
(10) Patent No.: US 8,789,001 B1
(45) Date of Patent: Jul. 22, 2014

(54) SYSTEM AND METHOD FOR USING FABRIC-GRAPH FLOW TO DETERMINE RESOURCE COSTS

(71) Applicants: Eric A. Sather, Palo Alto, CA (US); Steven Teig, Menlo Park, CA (US)

(72) Inventors: Eric A. Sather, Palo Alto, CA (US); Steven Teig, Menlo Park, CA (US)

(73) Assignee: Tabula, Inc., Mountain View, CA (US)

( * ) Notice: Subject to any disclaimer, the term of this patent is extended or adjusted under 35 U.S.C. 154(b) by 0 days.

(21) Appl. No.: 13/831,144

(22) Filed: Mar. 14, 2013

Related U.S. Application Data

(60) Provisional application No. 61/767,225, filed on Feb. 20, 2013.

(51) Int. Cl.
  *G06F 17/50* (2006.01)
  *G06F 9/00* (2006.01)
  *G06F 15/177* (2006.01)

(52) U.S. Cl.
  CPC ........ *G06F 17/5054* (2013.01); *G06F 17/5077* (2013.01); *G06F 17/5072* (2013.01); *G06F 9/00* (2013.01); *G06F 15/177* (2013.01)
  USPC ........... 716/128; 716/121; 716/116; 716/117; 713/2; 713/100

(58) Field of Classification Search
  CPC ........... G06F 17/5054; G06F 17/5077; G06F 17/5072; G06F 9/00; G06F 15/177
  USPC ............... 716/128, 121, 116, 117; 713/2, 100
  See application file for complete search history.

(56) References Cited

U.S. PATENT DOCUMENTS

| | | | |
|---|---|---|---|
| 5,659,484 | A | 8/1997 | Bennett et al. |
| 5,764,525 | A | 6/1998 | Mahmood et al. |
| 5,764,954 | A | 6/1998 | Fuller et al. |
| 5,889,677 | A | 3/1999 | Yasuda et al. |
| 6,066,178 | A | 5/2000 | Bair et al. |
| 6,086,628 | A | 7/2000 | Dave et al. |
| 6,086,631 | A | 7/2000 | Chaudhary et al. |

(Continued)

FOREIGN PATENT DOCUMENTS

JP  2010193350 A  *  9/2010

OTHER PUBLICATIONS

Albrecht, C., "Provably Good Global Routing by a New Approximation Algorithm for Multicommodity Flow," ISPD 2000, Month Unknown, 2000, pp. 19, 2-7, ACM, San Diego, CA.

(Continued)

*Primary Examiner* — Phallaka Kik
(74) *Attorney, Agent, or Firm* — Adeli LLP

(57) ABSTRACT

A system and method of determining paths of components when placing and routing configurable circuits. The method identifies a probabilistic data flow through multiple components using a simplified connection matrix. The simplified connection matrix is used to determine a probabilistic data flow through the components without data flowing from any component to itself. The probabilistic data flow is used to determine a probabilistic data flow through the components with some of the components having data flowing from themselves back to themselves. The probabilistic data flow through each component and the number of inputs of the components are used to determine a cost for each component. The cost of a path through the circuit is determined from the costs of the individual components in the path. The costs of the components are used to determine which path of components to use.

22 Claims, 23 Drawing Sheets

(56) References Cited

U.S. PATENT DOCUMENTS

| | | | |
|---|---|---|---|
| 6,088,519 A | 7/2000 | Koford | |
| 6,460,166 B1 | 10/2002 | Reddy et al. | |
| 6,487,709 B1 | 11/2002 | Keller et al. | |
| 6,501,297 B1 | 12/2002 | Kong | |
| 6,515,509 B1 | 2/2003 | Baxter | |
| 6,557,145 B2 | 4/2003 | Boyle et al. | |
| 6,650,142 B1* | 11/2003 | Agrawal et al. | 326/41 |
| 6,691,301 B2 | 2/2004 | Bowen | |
| 6,711,729 B1 | 3/2004 | McElvain et al. | |
| 6,838,904 B1* | 1/2005 | Agrawal et al. | 326/41 |
| 6,851,101 B1 | 2/2005 | Kong et al. | |
| 6,892,369 B2* | 5/2005 | Teig et al. | 716/129 |
| 6,894,527 B1 | 5/2005 | Donlin et al. | |
| 6,931,616 B2 | 8/2005 | Teig et al. | |
| 6,964,029 B2 | 11/2005 | Poznanovic et al. | |
| 7,003,745 B2 | 2/2006 | Subasic et al. | |
| 7,073,158 B2 | 7/2006 | McCubbrey | |
| 7,088,134 B1 | 8/2006 | Agrawal et al. | |
| 7,107,568 B2 | 9/2006 | Cronquist | |
| 7,143,377 B1 | 11/2006 | Kudlugi et al. | |
| 7,350,173 B1 | 3/2008 | Ang et al. | |
| 7,353,489 B2 | 4/2008 | Dowling | |
| 7,383,529 B2 | 6/2008 | Gupta et al. | |
| 7,480,885 B2 | 1/2009 | Frankle et al. | |
| 7,496,879 B2 | 2/2009 | Rohe et al. | |
| 7,657,855 B1 | 2/2010 | Manaker, Jr. et al. | |
| 7,743,354 B2 | 6/2010 | Albrecht et al. | |
| 7,779,380 B2 | 8/2010 | Honda | |
| 7,886,247 B2* | 2/2011 | Fatemi et al. | 716/136 |
| 7,904,867 B2 | 3/2011 | Burch et al. | |
| 7,941,776 B2 | 5/2011 | Majumder et al. | |
| 7,974,213 B2* | 7/2011 | Sinha et al. | 370/252 |
| 8,089,882 B2* | 1/2012 | Guntur et al. | 370/235 |
| 8,112,731 B1* | 2/2012 | Shen et al. | 716/116 |
| 8,136,077 B2 | 3/2012 | McMurchie et al. | |
| 8,166,435 B2 | 4/2012 | Teig et al. | |
| 8,458,629 B2 | 6/2013 | Caldwell et al. | |
| 2003/0079192 A1 | 4/2003 | Cheong et al. | |
| 2004/0225970 A1 | 11/2004 | Oktem | |
| 2005/0132316 A1 | 6/2005 | Suaris et al. | |
| 2005/0193359 A1 | 9/2005 | Gupta et al. | |
| 2006/0010415 A1 | 1/2006 | Curtin et al. | |
| 2006/0171346 A1* | 8/2006 | Kolavennu et al. | 370/328 |
| 2006/0225002 A1 | 10/2006 | Hassoun et al. | |
| 2007/0016881 A1 | 1/2007 | Gregory et al. | |
| 2007/0192752 A1 | 8/2007 | Bhattacharya et al. | |
| 2007/0214445 A1 | 9/2007 | Dehon et al. | |
| 2008/0028347 A1 | 1/2008 | Hiraoglu et al. | |
| 2008/0059937 A1* | 3/2008 | Rohe et al. | 716/16 |
| 2008/0127000 A1 | 5/2008 | Majumder et al. | |
| 2008/0216040 A1 | 9/2008 | Furnish et al. | |
| 2008/0276208 A1 | 11/2008 | Albrecht et al. | |
| 2009/0201899 A1* | 8/2009 | Liu et al. | 370/338 |
| 2009/0249276 A1* | 10/2009 | Wu et al. | 716/16 |
| 2009/0254874 A1 | 10/2009 | Bose | |
| 2009/0293028 A1 | 11/2009 | Hiraoglu et al. | |
| 2012/0124541 A1* | 5/2012 | Amundson et al. | 716/122 |
| 2012/0179809 A1* | 7/2012 | Barsness et al. | 709/224 |
| 2012/0185809 A1 | 7/2012 | Kadiyala et al. | |
| 2013/0099821 A1 | 4/2013 | Huang et al. | |
| 2013/0305199 A1* | 11/2013 | He et al. | 716/104 |
| 2013/0308468 A1* | 11/2013 | Cowie | 370/248 |
| 2014/0010104 A1* | 1/2014 | McReynolds et al. | 370/252 |

OTHER PUBLICATIONS

Alexander, Michael J., et al., "Placement and Routing for Performance-Oriented FPGA Layout," VLSI Design: An International Journal of Custom-Chip Design, Simulation, and Testing, Month Unknown, 1998, vol. 7, No. 1, pp. 1-23.
Alpert, C., et al., "A Semi-Persistent Clustering Technique for VLSI Circuit Placement," ISPD '05, Apr. 3-6, 2005, pp. 200-207, ACM, San Francisco, California, USA.
Author Unknown, "Adapt2000 ACM System Platform," Apr. 2004, pp. 1-39, QuickSilver Technology, Inc., San Jose, California, USA.
Author Unknown, "M2000, FlexEOS Embedded FPGA Cores," Month Unknown, 2003, 2 pages, M2000, France.
Axelsson, E., et al., "Wired: Wire-aware Circuit Design," Month Unknown, 2005, pp. 1-15.
Braunstein, L.A., et al., "Optimal Paths in Disordered Complex Networks," Physical Review Letters, Oct. 17, 2003, pp. 168701-(1)-168701-(4), vol. 91, No. 16, The American Physical Society.
Braunstein, L.A., et al., "Threat Networks and Threatened Networks: Basic Principles and Practical Applications," Apr. 4, 2005, pp. 1-31.
Brenner, U., et al., "An Effective Congestion Driven Placement Framework," ISPD '02, Apr. 7-10, 2002, pp. 6-11, ACM, San Diego, California, USA.
Butts, Michael, "Future Directions of Dynamically Reprogrammable Systems," IEEE 1995 Custom Integrated Circuits Conference, May 1995, pp. 487-494.
Cancho, R.F., et al., "The Topology of Technology Graphs: Small World Patterns in Electronic Circuits," Month Unknown, 2001, pp. 1-6.
Cancho, R.F., et al., "Topology of Technology Graphs: Small World Patterns in Electronic Circuits," Physical Review E, 2001, pp. 046119-(1)-046119-(5), vol. 64, 046119, The American Physical Society.
Chen, H., et al., "An Algebraic Multigrid Solver for Analytical Placement with Layout Based Clustering," DAC 2003, Jun. 2-6, 2003, 6 pages, ACM, Anaheim, California, USA.
Ciemat, Juan De Vicente, et al., "Annealing Placement by Thermodynamic Combinatorial Optimization," ACM Transactions on Design Automation of Electronic Systems, Jul. 2004, pp. 310-332, vol. 9, No. 3, ACM, New York, NY.
Compton, Katherine, et al., "Reconfigurable Computing: A Survey of Systems and Software," ACM Computing Surveys, Jun. 2002, pp. 171-210, vol. 34, No. 2, ACM, New York, NY.
Cong, J., et al., "A New Enhanced SPFD Rewiring Algorithm," Dec. 2002, 7 pages.
Cong, Jason, et al., "Combinational Logic Synthesis for LUT Based Field Programmable Gate Arrays," ACM Transactions on Design Automation of Electronic Systems, Apr. 1996, pp. 145-204, vol. 1, No. 2, ACM, Inc.
Cong, Jason, et al., "Large-Scale Circuit Placement," ACM Transactions on Design Automation of Electronic Systems, Apr. 2005, pp. 389-430, vol. 10, No. 2, ACM Inc., Broadway, New York, NY.
Cong, Jason, et al., "Optimality and Stability Study of Timing-Driven Placement Algorithms," ICCAD-2003: International Conference on Computer Aided Design, Nov. 2003, 7 pages.
Dehon, Andre, "Balancing Interconnect and Computation in a Reconfigurable Computing Array (or, why don't you really want 100% LUT utilization)," Proceedings of the International Symposium on Field Programmable Gate Arrays, Feb. 1999, pp. 1-10.
Dehon, Andre, et al., "Reconfigurable Computing: What, Why, and Implications for Design Automation," DAC 1999, Jun. 1999, 6 pages, ACM, New Orleans, Louisiana.
Eisenmann, H., et al., "Generic Global Placement and Floorplanning," DAC 98, Jun. 15-19, 1998, pp. 269-274, San Francisco, CA, USA.
Fleischer, L.K., "Approximating Fractional Multicommodity Flow Independent of the Number of Commodities," Proceedings of the 40th Annual Symposium on Foundations of Computer Science, Month Unknown, 1999, pp. 1-16.
Hurst, Aaron P., et al., "Physical Placement Driven by Sequential Timing Analysis," PROC. ICCAD '04, Month Unknown, 2004, pp. 379-386.
Hurst, Aaron P., et al., "Physical Placement Driven by Sequential Timing Analysis," PROC. ICCAD '04, Month Unknown, 2004, slides 1-21.
Hutchings, Brad L, et al., "Unifying Simulation and Execution in a Design Environment for FPGA Systems," IEEE Transactions on Very Large Scale Integration (VLSI) Systems, Feb. 2001, pp. 201-205, vol. 9, No. 1.
Hutchings, Brad, et al., "A CAD Suite for High-Performance FPGA Design," Proceedings of the Seventh Annual IEEE Symposium on Field-Programmable Custom Computing Machines, Apr. 1999, 13 pages.

(56) References Cited

OTHER PUBLICATIONS

Hutchings, Brad, et al., "Designing and Debugging Custom Computing Applications," IEEE Design & Test of Computers, Jan. 2000, pp. 20-28.

Kocan, Faith, et al., "Logic Modules with Shared SRAM Tables for Field-Programmable Gate Arrays," FPL 2004, Aug./Sep. 2004, pp. 289-300, Springer-Verlag, Berlin Heidelberg.

Lewis, David, et al., "The Stratix-II Routing and Logic Architecture," Proceedings of the 2005 ACM/SIGDA 13th International Symposium on Field-Programmable Gate Arrays, Feb. 20-22, 2005, pp. 1-22, Monterey, California, USA.

Li, C., et al., "Routability-Driven Placement and White Space Allocation," Mar. 2010, 8 pages.

Lin, Joey Y., et al., "Placement-Driven Technology Mapping for LUT-Based FPGAs," FPGA '03, Feb. 23-25, 2003, pp. 121-126, ACM, Monterey, California, USA.

Luk, Wayne, et al., "Compilation Tools for Run-Time Reconfigurable Designs," FPGAs for Custom Computing Machines, 1997 Proceedings., The 5th Annual IEEE Symposium on FPGA-Based Custom Computing Machines, Apr. 16-18, 1997, pp. 56-65.

Niedzielski, David, "An Overview of Reconfigurable Computing," Date Unknown, 26 pages.

Ramachandaran, P., et al., "Optimal Placement by Branch-and-Price," Month Unknown, 2005, 6 pages.

Ren, H., et al., "Sensitivity Guided Net Weighting for Placement Driven Synthesis," ISPD '04, Apr. 18-21, 2004, 8 pages, ACM, Phoenix, Arizona, USA.

Sankar, Yaska, "Ultra-Fast Automatic Placement for FPGAs," A Thesis Submitted in Conformity with the Requirements for the Degree of Master of Applied Science Graduate Dept. of Electrical and Computer Engineering, University of Toronto, Month Unknown, 1999, pp. ii-73.

Schmit, Herman, "Incremental Reconfiguration for Pipelined Applications," Proceedings of the 5th IEEE Symposium on FPGA-Based Custom Computing Machines, Apr. 16-18, 1997, 9 pages.

Scholl, C., "Multi-output Functional Decomposition with Exploitation of Don't Cares," May 19-21, 1997, 6 pages.

Sharma, Akshay, et al., "Accelerating FPGA Routing Using Architecture-Adaptive A* Techniques," Proceedings of the IEEE Conference on Field-Programmable Technology 2005, Dec. 11-14, 2005, 10 pages.

Singh, Amit, et al., "Interconnect Resource-Aware Placement for Hierarchical FPGAs," Proceedings of the 2001 IEEE/ACM International Conference on Computer-Aided Design, Nov. 2001, 5 pages.

Soviani, Cristian, et al., "Optimizing Sequential Cycles through Shannon Decomposition and Retiming", Design, Automation, and Test in Europe, Mar. 10, 2006, pp. 1085-1090.

Tom, Marvin, et al., "Clustering of Large Designs for Channel-Width Constrained FPGAs," University of British Columbia, Department of Electrical and Computer Engineering, Jun. 2005, slides 1-39, Vancouver, British Columbia, Canada.

Tom, Marvin, et al., "Logic Block Clustering of Large Designs for Channel-Width Constrained FPGAs" DAC 2005, Jun. 13-17, 2005, pp. 726-731, ACM, Anaheim, California, USA.

Tong, K.Y., et al., "Regular Logic Fabrics for a Via Patterned Gate Array (VPGA)," Proceedings of the IEEE 2003 Custom Integrated Circuits Conference 2003, Sep. 21-24, 2003, 4 pages.

Trimberger, Stephen, "Effects of FPGA Architecture on FPGA Routing," 32nd ACM/IEEE Design Automation Conference, Jun. 1995, 5 pages, ACM.

Tsay, R. S., et al., "An Analytic Net Weighting Approach for Performance Optimization in Circuit Placement," 28th ACM/IEEE Design Automation Conference, Month Unknown, 1991, pp. 620-625, Paper 37.2, ACM.

Vemuri, N., et al., "BDD-Based Logic Synthesis for LUT-Based FPGAs," ACM Transactions on Design Automation of Electronic Systems, Oct. 2002, pp. 501-525, vol. 7, No. 4, ACM.

Zuchowski, Paul S., et al., "A Hybrid ASIC and FPGA Architecture," Proceedings of the 2002 IEEE/ACM International Conference on Computer-Aided Design, Nov. 10-14, 2002, 8 pages, San Jose, California, USA.

\* cited by examiner

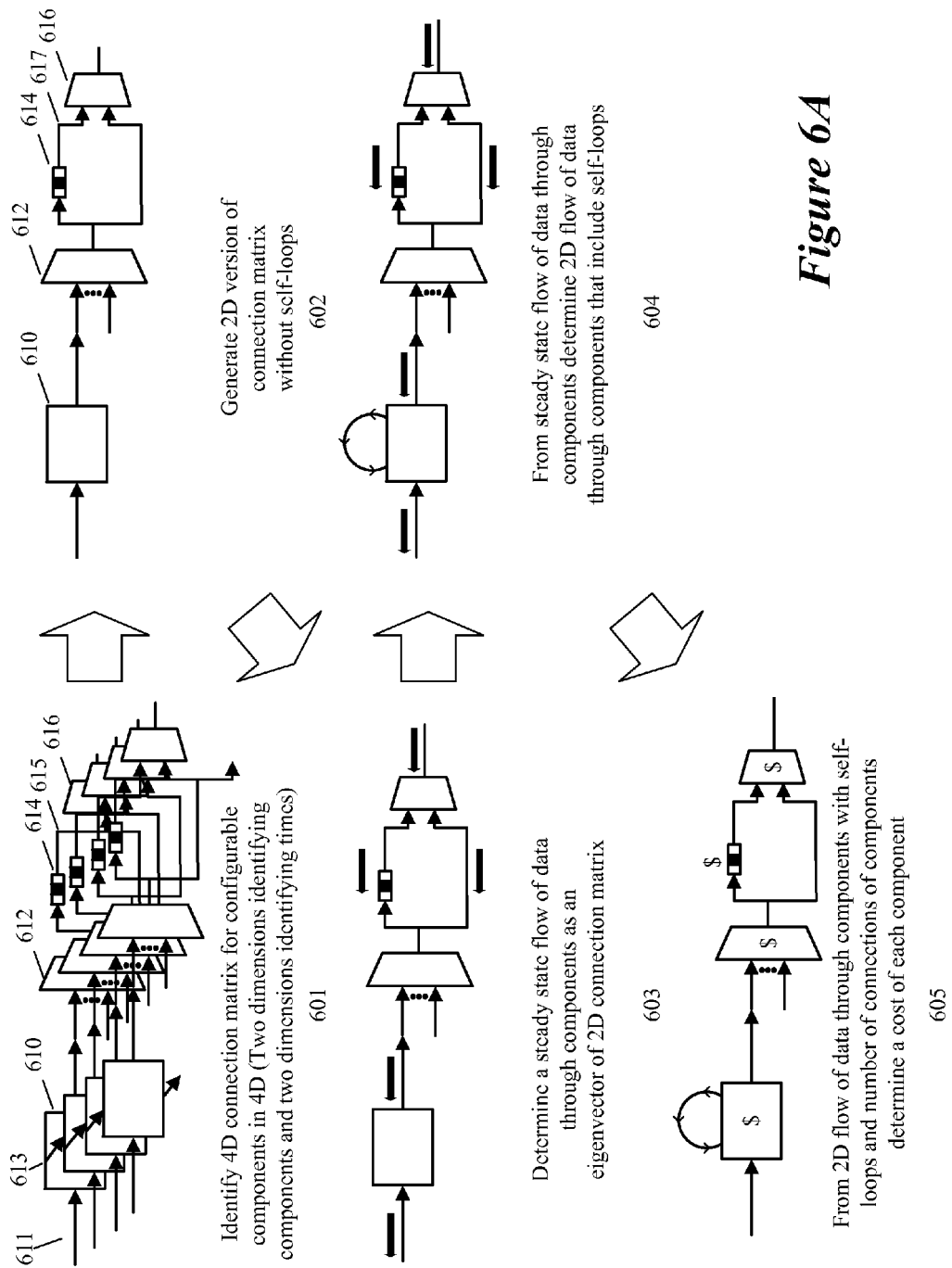

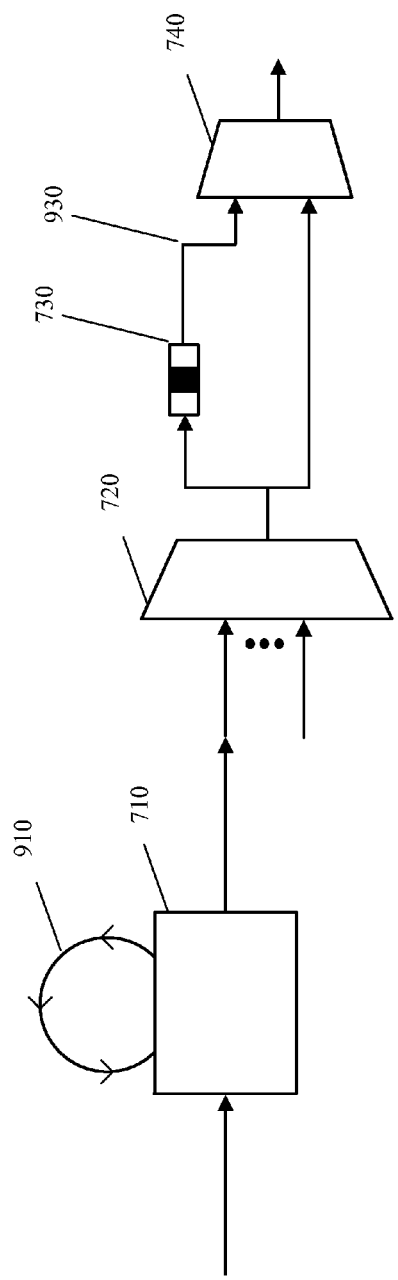
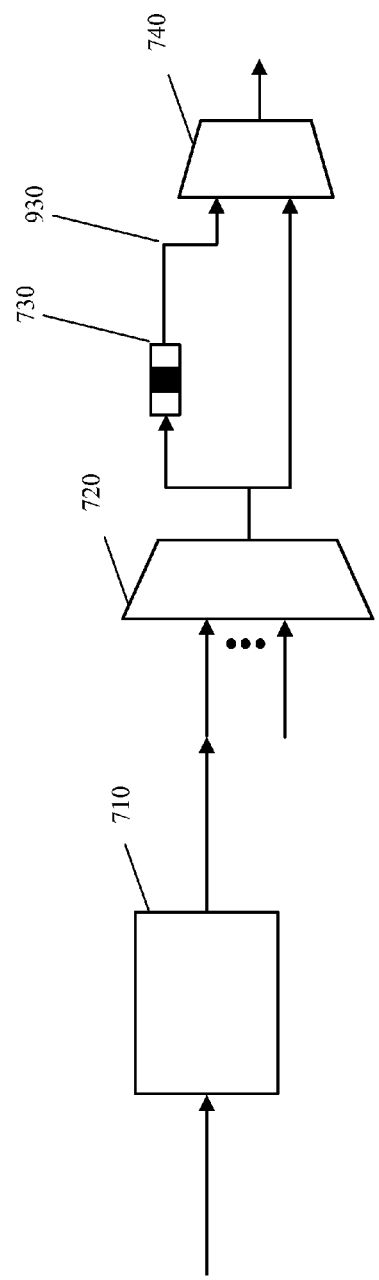

SYSTEM AND METHOD FOR USING FABRIC-GRAPH FLOW TO DETERMINE RESOURCE COSTS

CLAIM OF BENEFIT TO PRIOR APPLICATIONS

The present Application claims the benefit of U.S. Provisional Patent Application 61/767,225, entitled, "System and Method for Using Fabric-Graph Flow to Determine Resource Costs," filed Feb. 20, 2013. The contents of U.S. Provisional application 61/767,225 are hereby incorporated by reference.

BACKGROUND

The use of configurable integrated circuits ("ICs") has dramatically increased in recent years. One example of a configurable IC is a field programmable gate array ("FPGA"). An FPGA is a field programmable IC that often has logic circuits, interconnect circuits, and input/output ("I/O") circuits. The logic circuits (also called logic blocks) are typically arranged as an internal array of repeated arrangements of circuits. These logic circuits are typically connected together through numerous interconnect circuits (also called interconnects). The logic and interconnect circuits are often surrounded by the I/O circuits.

These ICs implement a user design. In order to implement the user design, the ICs must be configured. A configuration must be defined before it can be implemented on an IC with configurable components. The process for defining a configuration requires determining that particular components are part of one set of circuits that constitute a path for data and not another set of circuits that constitute a different path for data. This determination is, however, performed without regard to the amount of data flow that would be blocked by assigning the component to a particular path.

SUMMARY OF THE INVENTION

The outputs of configurable components of an IC can each only be used by one path of data through the circuit at a time in some embodiments. Accordingly, some embodiments determine a cost for using each component based on the flow that would be blocked by using that component at that time. Some embodiments determine a path through the configurable components of the IC based on the relative costs of the components that are available to construct those paths through components over time. In order to calculate the costs, some embodiments calculate a flow of data through a component and then determine how much of that flow is blocked by assuming that the fraction of the flow that is blocked is proportional to the number of inputs (other than those used for the path) of the component that are made unavailable to other paths. Some embodiments identify a set of components to be considered (i.e., evaluated as to the costs of the component) together. For example, some embodiments consider all components in a particular region of the IC. These embodiments then calculate a probabilistic data flow through each component that is being considered (or in some embodiments a data flow through defined groups of components being considered) before calculating the costs for a path.

The probabilistic data flow is calculated in some embodiments by determining the probabilistic flow based on the number of inputs and outputs of each component in a set of components being considered. The set of components being considered at a given time, in some embodiments, are the components in a tile, some or all of the components in a group of tiles, or all components of an IC.

In some embodiments, a connection matrix is calculated that defines the connections between individual components being considered. This connection matrix is used to calculate a steady state probabilistic data flow through the components being considered. In some embodiments, the connection matrix is simplified from a 4-dimensional or 3-dimensional connection matrix to a 2-dimensional connection matrix before the flows through the components are calculated. In some embodiments, the 2-dimensional connection matrix is further simplified to eliminate conditions where probabilistic data flow can flow from a component back to the same component (such a condition is called a "self-loop", herein). In some embodiments, once the flow through each component is calculated using the simplified 2-dimensional matrix (without self-loops), the flows through some or all of the components are then recalculated to determine the flows that would be calculated using a matrix with self-loops. That is, the embodiments calculate a probabilistic data flow that accounts for probabilistic flow of data out of a component and back into the same component.

Once the probabilistic data flow is determined, some embodiments use both (i) the probabilistic flow through each component and (ii) the number of inputs of that component to determine a cost for that component. The total cost of a path is then determined based on the costs of the individual components in that path. Some embodiments then define a set of configurations to implement a path based on the relative costs of multiple possible paths of components.

The preceding Summary is intended to serve as a brief introduction to some embodiments described herein. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description and the Drawings is needed. Moreover, the claimed subject matters are not to be limited by the illustrative details in the Summary, Detailed Description and the Drawings, but rather are to be defined by the appended claims, because the claimed subject matters can be embodied in other specific forms without departing from the spirit of the subject matters.

BRIEF DESCRIPTION OF THE FIGURES

FIG. 6A conceptually illustrate a series of operations of some embodiments that generate a routing cost for using each component of a set of components.

FIG. 9 conceptually illustrates a graphical representation of the connections between the components identified by 2D connection matrix $M_{2A}$.

FIG. 10 conceptually illustrates a graphical representation of the connections between the components identified by 2D connection matrix without self-loops, $M_{2B}$.

DETAILED DESCRIPTION

The outputs of configurable components of an IC can each be used by only one path of data through the circuit at a time in some embodiments. Accordingly, some embodiments determine a cost for using each component based on the flow that would be blocked by using that component at that time. Some embodiments determine a path through the configurable components of the IC based on the relative costs of the components that are available to construct those paths through components over time. In order to calculate the costs, some embodiments calculate a flow of data through a component and then determine how much of that flow is blocked by assuming that the fraction of the flow that is blocked is proportional to the number of inputs (other than those used for the path) of the component that are made unavailable to other paths. Some embodiments calculate a probabilistic data flow through each considered component or through groups of components before calculating the costs for a path.

I. Introduction

The ICs of some embodiments are sub-cycle reconfigurable circuits. Such ICs operate on two different clock cycles. The ICs operate on a long (slower) clock cycle called a "user cycle". The long clock cycle is called a "user cycle" because the IC implements a user design and performs all operations of the user design (or their equivalents) in each user cycle. The ICs also operate on a short clock cycle, a sub-cycle. Some or all individual components of the ICs of some embodiments perform one operation in each sub-cycle. The combination of the operations of the sub-cycle configurable components and (in some embodiments) user cycle configurable components together implement the user design. The number of sub-cycles in each user cycle is called the "looperness" of the IC. Some ICs have a looperness of 8, 16, or other numbers.

A. Reconfigurable Circuits

Figure 1:
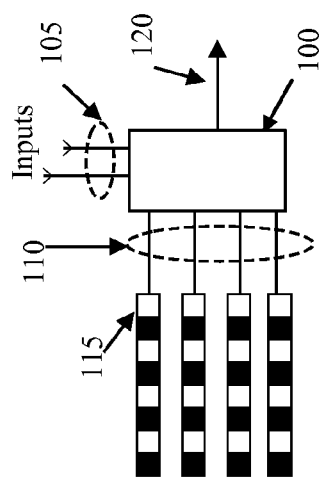
FIG. 1 illustrates an example of a sub-cycle reconfigurable logic circuit.

FIG. 1 illustrates an example of a sub-cycle reconfigurable logic circuit 100. This logic circuit can be configured once per sub-cycle to perform one of a number of different functions. As shown in FIG. 1, the logic circuit 100 receives a set of input data 105 and a set of configuration data 110. The configuration data set is stored in a set of SRAM cells 115. The set of SRAM cells 115 stores a full configuration for the logic circuit for each sub-cycle. From the set of functions that the logic circuit 100 can perform, the configuration data set specifies a particular function that this circuit has to perform on the input data set. Once the logic circuit performs its function on the input data set, it provides the output of this function on a set of output lines 120. The logic circuit 100 is said to be configurable, as the configuration data set "configures" the logic circuit to perform a particular function, and this configuration data set can be modified by writing new data in the SRAM cells. Multiplexers and look-up tables are two examples of configurable logic circuits.

Figure 2:
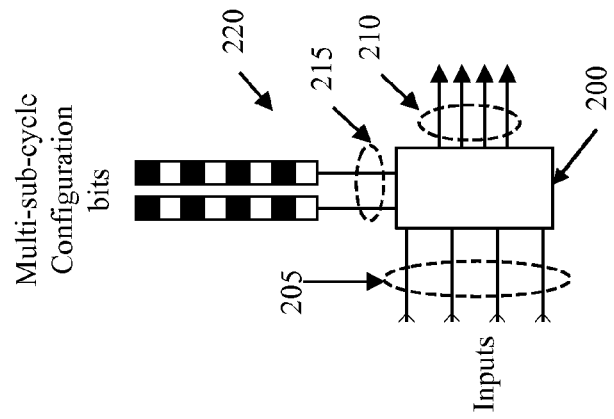
FIG. 2 illustrates an example of a sub-cycle reconfigurable interconnect circuit.

FIG. 2 illustrates an example of a sub-cycle reconfigurable interconnect circuit 200. This interconnect circuit 200 connects a set of input data 205 to a set of output data 210. This circuit receives configuration data 215 that are stored in a set of SRAM cells 220. The set of SRAM cells 220 store a full configuration for the interconnect circuit for each sub-cycle. The configuration data specifies how the interconnect circuit should connect the input data set to the output data set. The interconnect circuit 200 is said to be configurable, as the configuration data set "configures" the interconnect circuit to use a particular connection scheme that connects the input data set to the output data set in a desired manner. Moreover, this configuration data set can be modified by writing new data in the SRAM cells. Multiplexers are one example of interconnect circuits.

B. IC Architecture

Figure 3:
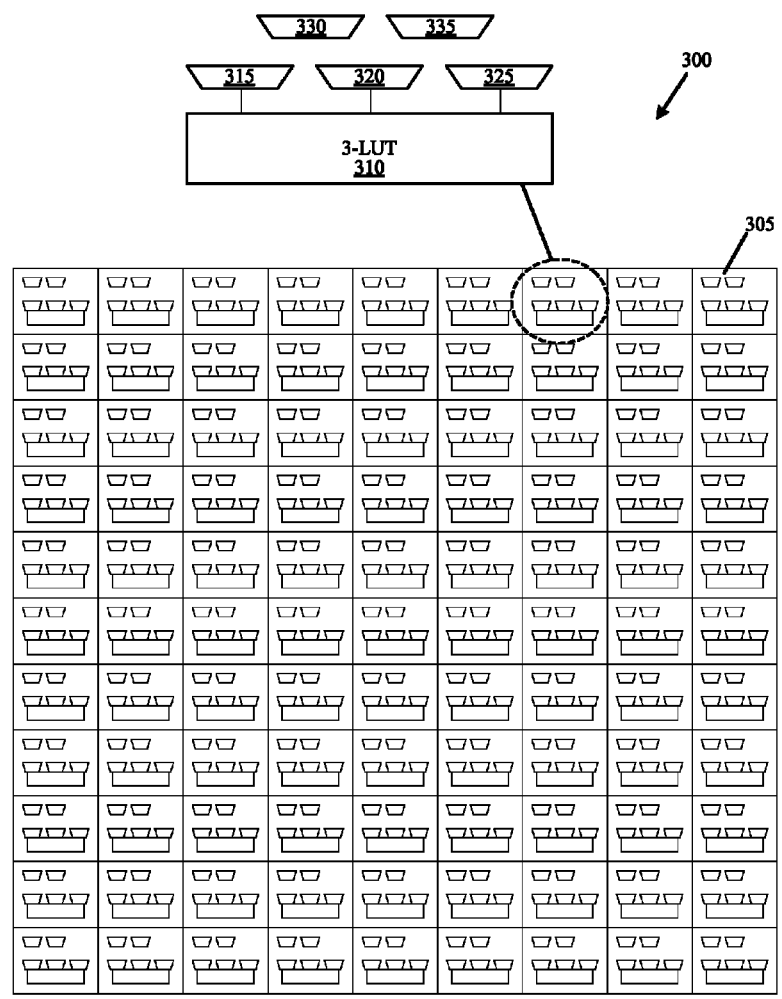
FIGS. 3-4 illustrate multiple configurable circuit arrangements/architectures that include the invention's circuits.
Figure 4:
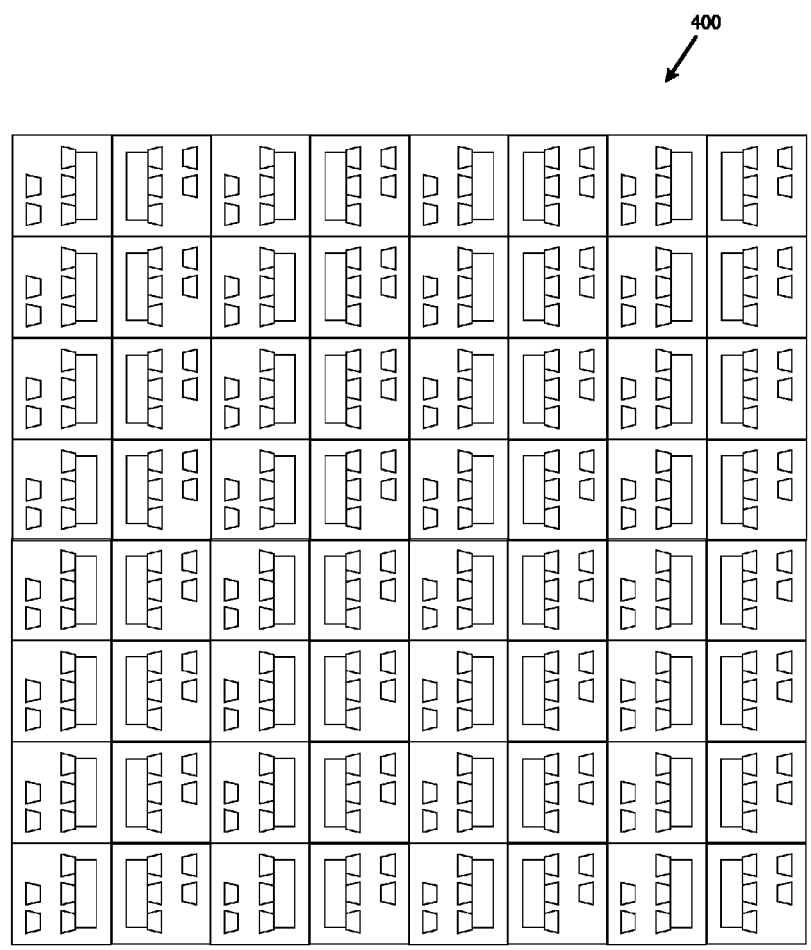

FIGS. 3-4 illustrate multiple configurable circuit arrangements/architectures that include the invention's circuits. One such architecture is illustrated in FIG. 3. The architecture of FIG. 3 is formed by numerous configurable tiles 305 that are arranged in an array with multiple rows and columns. In FIG. 3, each configurable tile includes a configurable three-input LUT 310, three configurable input-select multiplexers 315, 320, and 325 and two configurable routing multiplexers 330 and 335. Different embodiments have different number of configurable interconnect circuits 330. For instance, some embodiments may have eight configurable interconnect circuits while others may have more or less such circuits. For each configurable circuit, the configurable IC 300 includes a set of storage elements (e.g., a set of SRAM cells) for storing a set of configuration data bits. Storage elements may alternatively be referred to as storage circuits.

In some embodiments, the logic circuits are look-up tables while the interconnect circuits are multiplexers. Also, in some embodiments, the LUTs and the multiplexers are sub-cycle reconfigurable circuits (sub-cycles of reconfigurable circuits may be alternatively referred to as "reconfiguration cycles"). In some of these embodiments, the configurable IC stores multiple sets of configuration data for a sub-cycle reconfigurable circuit, so that the reconfigurable circuit can use a different set of configuration data in different sub-cycles.

Other configurable tiles can include other types of circuits, such as memory arrays instead of logic circuits.

In FIG. 3, an input-select multiplexer (also referred to as an "IMUX") 315 is an interconnect circuit associated with the LUT 310 that is in the same tile as the input select multiplexer. One such input select multiplexer receives several input signals for its associated LUT and passes one of these input signals to its associated LUT. In some embodiments, some of the input-select multiplexers are hybrid input-select/logic circuits (referred to as "HMUXs") capable of performing logic operations as well as functioning as input select multiplexers. An HMUX is a multiplexer that can receive "user-design signals" along its select lines.

A user-design signal within a configurable IC is a signal that is generated by a circuit (e.g., logic circuit) of the configurable IC. The word "user" in the term "user-design signal" connotes that the signal is a signal that the configurable IC generates for a particular application that a user has configured the IC to perform. User-design signal is abbreviated to user signal in some of the discussion in this document. In some embodiments, a user signal is not a configuration or clock signal that is generated by or supplied to the configurable IC. In some embodiments, a user signal is a signal that is a function of at least a portion of the set of configuration data received by the configurable IC and at least a portion of the inputs to the configurable IC. In these embodiments, the user signal can also be dependent on (i.e., can also be a function of) the state of the configurable IC. The initial state of a configurable IC is a function of the set of configuration data received by the configurable IC and the inputs to the configurable IC. Subsequent states of the configurable IC are functions of the set of configuration data received by the configurable IC, the inputs to the configurable IC, and the prior states of the configurable IC.

In FIG. 3, a routing multiplexer (also referred to as an RMUX) 330 is an interconnect circuit that at a macro level connects other logic and/or interconnect circuits. In other words, unlike an input select multiplexer in these figures that only provides its output to a single logic circuit (i.e., that only has a fan out of 1), a routing multiplexer in some embodiments either provides its output to several logic and/or interconnect circuits (i.e., has a fan out greater than 1), or provides its output to at least one other interconnect circuit.

In some embodiments, the RMUXs depicted in FIG. 3 form the routing fabric along with the wire-segments that connect to the RMUXs, and the vias that connect to these wire segments and/or to the RMUXs. In some embodiments, the routing fabric further includes buffers for achieving one or more objectives (e.g., to maintain the signal strength, reduce noise, alter signal delay, etc.) with respect to the signals passing along the wire segments. Various wiring architectures can be used to connect the RMUXs, IMUXs, and LUTs. Several examples of the wire connection scheme are described in U.S. Pat. No. 7,295,037.

Several embodiments are described below by reference to a "direct connection." In some embodiments, a direct connection is established through a combination of one or more wire segments, and potentially one or more vias, but no intervening circuit. In some embodiments, a direct connection does not include any intervening configurable circuits. In some embodiments, a direct connection might however include one or more intervening buffer circuits but no other type of intervening circuits. In yet other embodiments, a direct connection might include intervening non-configurable circuits instead of or in conjunction with buffer circuits. In some of these embodiments, the intervening non-configurable circuits include interconnect circuits, while in other embodiments they do not include interconnect circuits.

In the discussion below, two circuits might be described as directly connected. This means that the circuits are connected through a direction connection. Also, some connections are referred to below as configurable connections and some circuits are described as configurably connected. Such references signifies that the circuits are connected through a configurable interconnect circuit (such as a configurable routing circuit).

In some embodiments, the examples illustrated in FIG. 3 represent the actual physical architecture of a configurable IC. However, in other embodiments, the examples illustrated in FIG. 3 topologically illustrate the architecture of a configurable IC (i.e., they conceptually show the configurable IC without specifying a particular geometric layout for the position of the circuits).

In some embodiments, the position and orientation of the circuits in the actual physical architecture of a configurable IC are different from the position and orientation of the circuits in the topological architecture of the configurable IC. Accordingly, in these embodiments, the ICs physical architecture appears quite different from its topological architecture. For example, FIG. 4 provides one possible physical architecture 400 of the configurable IC 300 illustrated in FIG. 3.

Having the aligned tile layout with the same circuit elements of FIG. 4 simplifies the process for designing and fabricating the IC, as it allows the same circuit designs and mask patterns to be repetitively used to design and fabricate the IC. In some embodiments, the similar aligned tile layout not only has the same circuit elements but also have the same exact internal wiring between their circuit elements. Having such layout further simplifies the design and fabrication processes as it further simplifies the design and mask making processes.

Some embodiments might organize the configurable circuits in an arrangement that does not have all the circuits organized in an array with several aligned rows and columns. Therefore, some arrangements may have configurable circuits arranged in one or more arrays, while other arrangements may not have the configurable circuits arranged in an array.

C. Storage Elements

Some embodiments provide a configurable integrated circuit ("IC") that includes a configurable routing fabric with storage elements. Examples of such storage elements include transparent storage elements (e.g., latches) and non-transparent storage elements (e.g., registers). A latch is a storage element that can operate transparently, not needing, for example, a clock signal. Specifically, based on an enable signal, a latch either holds its output constant (i.e., is closed) or passes its input to its output (i.e., is open). For instance, a latch (1) might pass a signal on its input terminal to its output terminal when the enable signal is not active (e.g., when the signal on the enable terminal is logic low) and (2) might store a value and hold its output constant at this value when the enable signal is active (e.g., when the signal is logic high). Such a latch typically stores the value that it was receiving when the enable signal transitions from its inactive state (e.g., low) to its active state (e.g., high). Some latches do not include a separate enable signal, instead the input signal (or combination of input signals) to the latch acts as an enable signal.

A register is a storage element that cannot operate transparently. For instance, some registers operate based on a control signal (e.g., a periodic clock signal) received on the control terminal. Based on this signal, the register either holds its output constant or passes its input to its output. For instance, when the control signal makes a transition (e.g., goes from logic low to logic high), the register samples its input. Next, when the control signal is constant or makes the other transition, the register provides at its output the value that it most recently sampled at its input. In a register, the input data typically must be present a particular time interval before and after the active clock transition. A register is often operated by a clock signal that causes the register to pass a value every clock cycle, while a latch is often controlled by a control signal, but this is not always have to be the case.

ICs used in some embodiments include elements that operate as transparent latches referred to as "time vias" ("TVs") or clock driven latches referred to as "conduits." When a TV is "open," the TV's output value immediately assumes the TV's current input value. In other words, the TV acts as a wire (with some additional delay of less than one sub-cycle). When the TV closes, it captures and holds the current output value (i.e., the output no longer follows the input).

Conduits, unlike TVs, introduce delay when performing a storage operation. In some embodiments, conduits are implemented as single edge-triggered flip-flops. In some embodiments, multiple conduits are chained together to provide longer delays, as necessary.

Figure 5:
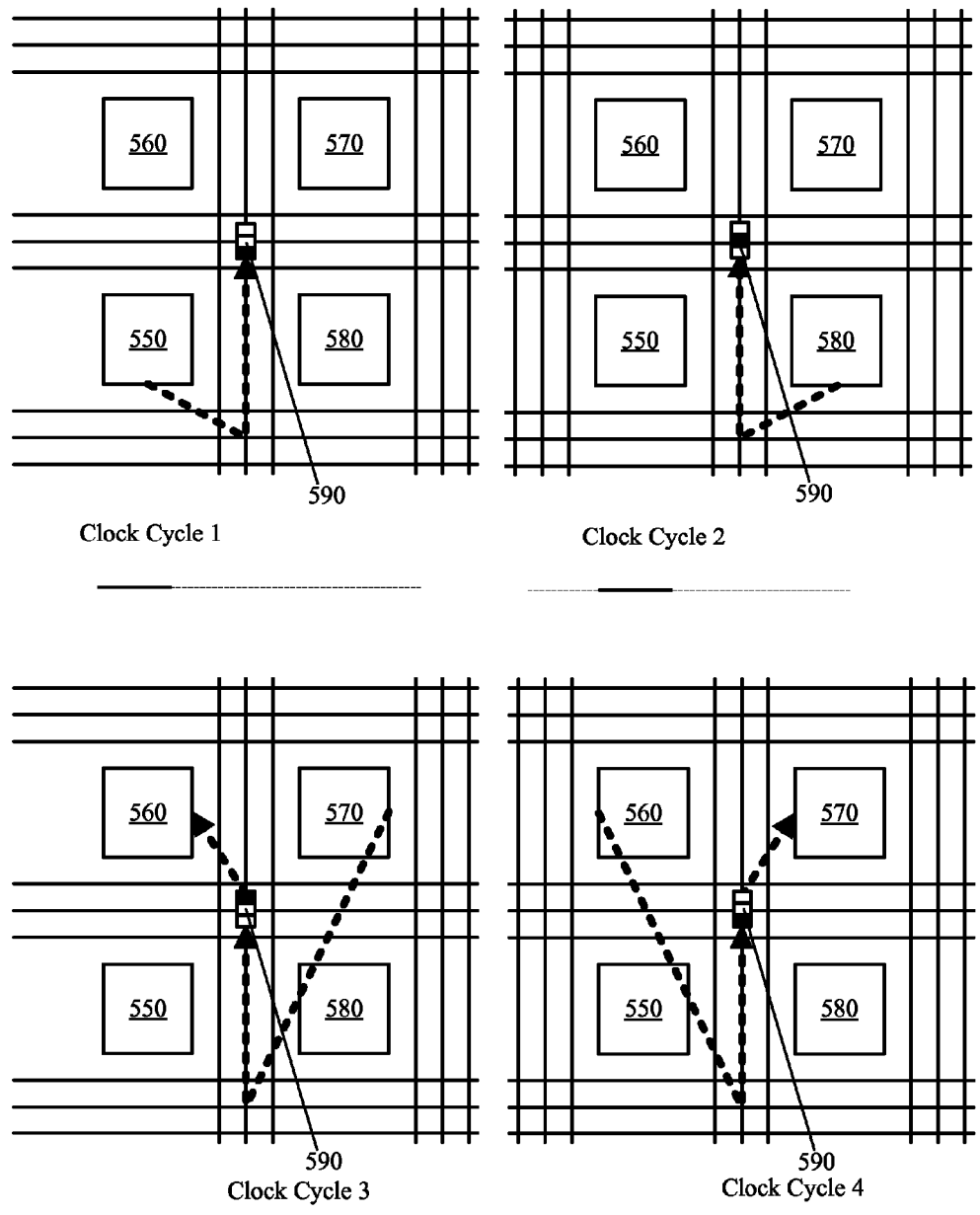
FIG. 5 illustrates the operations of clocked storage elements within the routing fabric of a configurable IC.

When a group of conduits that each cause a delay of one clock cycle are chained together, the combined structure is a conduit that delays signals by the same number of sub-cycles as the number of one clock cycle conduits in the group. The clock cycles are whatever cycle the conduit operates on, whether user cycle or sub-cycles FIG. 5 illustrates the operations of a conduit that delays signals by 2 clock cycles (e.g., a signal arriving in clock cycle 1 is delayed until clock cycle 3). A component 550 is outputting a signal for processing by component 560 at clock cycle 3. Therefore, the signal from component 550 must be stored until clock cycle 3. Hence, the signal is stored within the conduit 590 located within the routing fabric. By storing the signal from component 550 within the routing fabric during clock cycles 1 and 2, components 550 and 560 remain free to perform other operations during this time period. At clock cycle 2, component 580 is outputting a signal for processing by component 570 at clock cycle 4. At clock cycle 2, conduit 590 is storing the value received at clock cycle 1, and receiving a value from component 580 for storage as well.

At clock cycle 3, component 560 is ready to receive the first stored signal (from cycle 1) and therefore the conduit 590 passes the value. At clock cycle 3, conduit 590 continues to store the value received in clock cycle 2. Further, at clock cycle 3, storage element 590 receives a value from component 570 for future processing. At clock cycle 4, component 570 is ready to receive the second stored signal (from clock cycle 2) and therefore the clock cycle 590 passes the value. Further, at clock cycle 4, storage element 590 continues to store the value received during clock cycle 3, while also receiving a new value from component 560. It should be apparent to one of ordinary skill in the art that the clock cycles of some embodiments described above could be either (1) sub-cycles within or between different user design clock cycles of a reconfigurable IC, (2) user-design clock cycles, or (3) any other clock cycle.

In some embodiments, a program determines a cost for each component based on the amount of potential data flow blocked by the use of that component for a particular path. The higher the amount of potential data flow blocked by the use of a component, the more expensive that component is to use in a path. Because the actual amount of data flowing through a component can't be determined in advance, some embodiments use a probabilistic flow of data to determine the costs of the components. Calculations of probabilistic flows of data assume that the probabilistic data flows split when connections between components split and recombine when connections between components recombine.

In some embodiments, the potential data flow blocked by the use of a component in a particular path is determined based on a probabilistic flow of data through the component and by the number of inputs of the component. In order to determine the probabilistic flow of data through a component, some embodiments generate a connection matrix that represents the connections between various components. Each element of the connection matrix represents a fraction of the data flow from one component that flows to another component. The connection matrix is then used to determine a steady state probabilistic flow of data through the components whose connections are represented by the matrix. In some embodiments, the connection matrices are simplified before the flow is calculated.

FIG. 6A conceptually illustrates a series of operations performed by some embodiments for generating a routing cost for using each component of a set of components in a path. FIG. 6A is illustrated in 5 stages, 601-605. The figure conceptually illustrates the components of a physical IC and the connections between those components in different sub-cycles. In this figure, the components are a time via 610, a p-input MUX 612 (where p is a number more than two), a conduit 614, and a two-input MUX 616.

In stage 601, the components are illustrated during four separate sub-cycles. The arrows between the components represent physical and temporal connections between the components. For example, arrow 611 represents a physical input into time-via 610, arrow 613 represents a temporal connection from time via 610 in a first sub-cycle to the same time via 610 in a second sub-cycle, and arrow 615 represents a connection from conduit 614 in one sub-cycle to MUX 616 in the following sub-cycle.

Each connection between two components can be represented as an element of a matrix. Each connection has a starting component (c), an ending component (c'), a starting sub-cycle (t) and an ending sub-cycle (t'). Accordingly, the embodiment illustrated in FIG. 6A identifies a 4-dimensional (4D) connection matrix, $M_4$ with elements $M_4(c, t, c', t')$ representing the connections between the components.

The embodiment defines a probabilistic flow, $f(c', t')$, of data through each component c' at each time t' (in sub-cycles). The probabilistic flow splits among the outputs of connections of the component c'. Given a particular set of connections between component c' and other components, a fraction of that probabilistic flow of data (i.e., a fraction of $f(c', t')$) will pass to component c in a sub-cycle t. In some embodiments, the probabilistic flow of data is calculated backward from the actual direction of travel of data during operation of the IC. That is, the probabilistic flow of data though each component enters through the output(s) of the component and leaves through the input(s) of the component. In such embodiments, the element $M_4(c, t, c', t')$ is defined to be the fraction of the flow through component c' at time t' that goes to component c at time t.

In some embodiments each element $M_4(c, t, c', t')$ identifies the fractional flow through a single connection between component c and component c' in sub-cycles t and t', respectively. For a large set of components, the values of the elements of $M_4$ are mostly zero, because most components directly connect to a small number of other components and do not connect directly to most other components. Furthermore, even those components that do connect directly, usually connect only in a small number of sub-cycle pairs t and t'.

It is possible to determine a flow of data f(c',t') for each component c' at each sub-cycle t' using connection matrix $M_4$. However, it is computationally expensive to do so when the matrix represents connections for a large number of components. Accordingly, some embodiments do not use the matrix $M_4$ to calculate the flow through each component at each time, but instead use a simplified version of the matrix to calculate a flow through each component. Some embodiments simplify the matrix $M_4$ by assuming that the probabilistic flow of data through each component is uniform in time. Some embodiments further simplify the matrix by eliminating the time factor and generating a matrix representing connections, without respect to any delays of the flow of data from one component to another. Some embodiments go still further by considering only connections from a component to other components and ignoring connections from a component to itself (called a self-loop).

The components illustrated in stage 602 are shown as being connected only by the physical connections between the components and do not illustrate the temporal aspects of the connections (e.g., input 617 connects to MUX 616 directly instead of to the same MUX 616 in a later sub-cycle, etc.). Furthermore, connections from one component to itself that represent data flowing from a component to itself in a later sub-cycle (e.g., connection 613) are not considered in this simplified component diagram.

The set of connections in this simplified component diagram can be represented by a simplified, 2D matrix without self-loops. The 2D connection matrix without self-loops is referred to herein as $M_{2B}$ with elements $M_{2B}(c, c')$. The matrix $M_{2B}$ is a simplification of a matrix $M_{2A}$ which is a 2D connection matrix with self-loops. These matrices and other matrices mentioned in this section are further defined later in this application. In some embodiments, the matrix is further adjusted to simulate a recirculation of flow out of or into components whose connections are outside the scope of the connection matrix. The 2D connection matrix without self-loops and with recirculation is referred to herein as $M_{2C}$ with elements $M_{2C}(c, c')$.

After simplifying the matrix, the illustrated method, in stage 603, calculates a steady state 2D flow $f_{2C}$ (each component c having a flow $f_{2C}(c)$) of data through the components that is consistent with the 2D connection matrix, $M_{2C}$, without self-loops and with recirculation. In some embodiments, the steady state 2D flow $f_{2C}$ is computed by determining an eigenvector (each element of the vector being a steady state flow of one component) of $M_{2C}$ with an eigenvalue of one. Some embodiments then, in stage 604, use the 2D flow of data $f_{2C}$ (calculated without considering self-loops) through the components to determine a 2D flow of data $f_{2D}$ (with flow through self-loops included) through the components. The embodiments then, in stage 605 determine a cost value for each component based on (i) the 2D flow of data $f_{2D}(c)$ (with self-loops included) through the component and (ii) the number of inputs of the component.

Figure 6B:
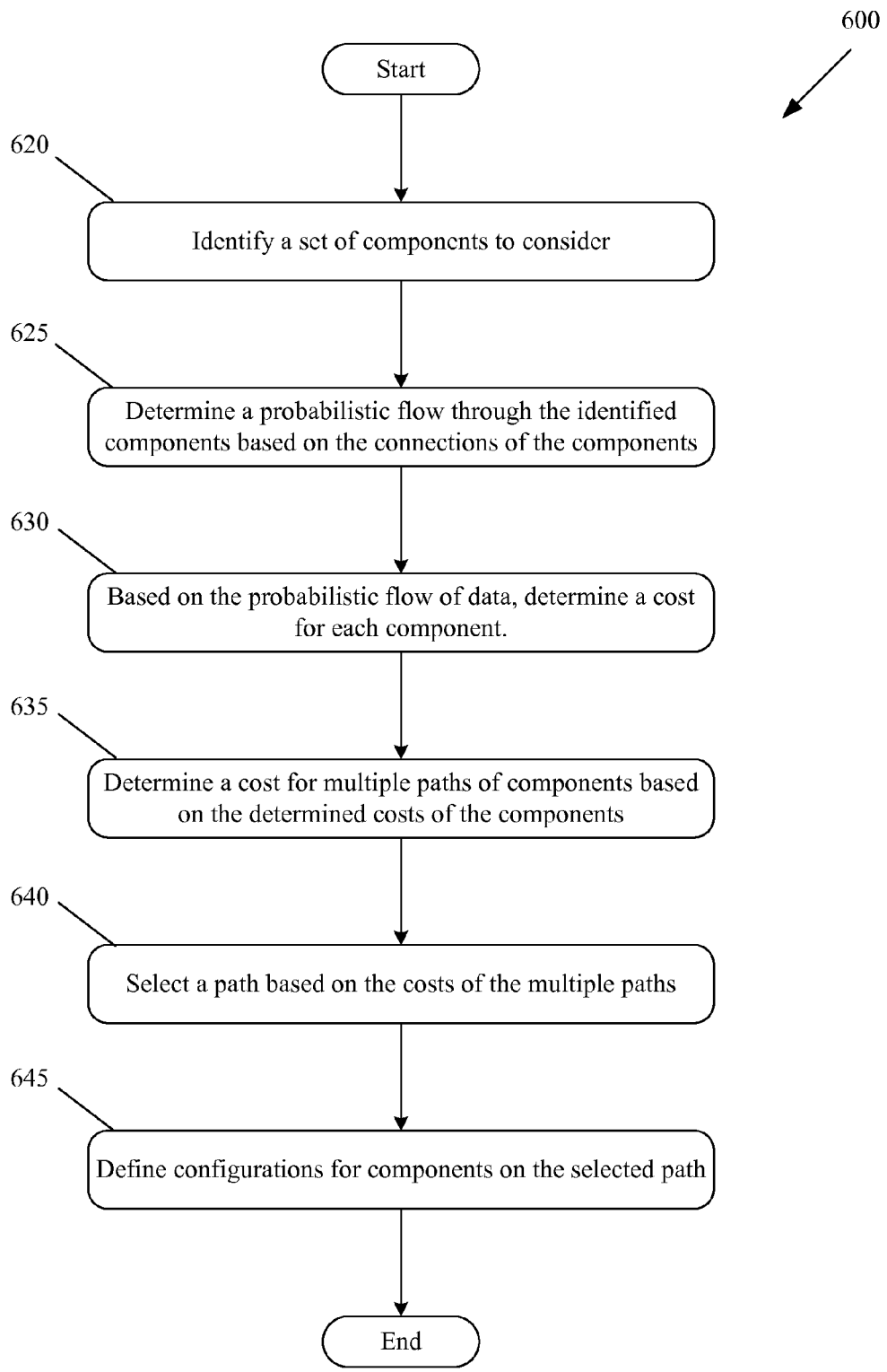
FIG. 6B illustrates a process of some embodiments for defining configurations for components for a path of components that carry data on an IC with configurable circuits.

FIG. 6B conceptually illustrates a process 600 of some embodiments for determining a cost for a path of components through which data flows. The process 600 begins by identifying (at 620) a set of components to consider. In some embodiments, the process 600 identifies components in a tile, in a set of tiles, or on an entire IC to consider when determining costs of components.

The process 600 then determines (at 625) a probabilistic flow through the identified components based on the connections of the components. The process 600 of some embodiments determines the probabilistic flow of data by generating a connection matrix for the components, then uses the matrix, or a simplified and/or adjusted version of the matrix to identify a steady state probabilistic flow through the components. The process 600 then determines (at 630) a cost for each of the considered components based on the probabilistic flow of data through the component. In some embodiments, the cost for each component is also dependent on the number of inputs of the component.

The process 600 then determines (at 635) a cost for each of multiple paths for data through the components. The process selects (at 640) a path based on the costs of the multiple paths. In some embodiments, this path is the cheapest path based on the cost of the individual components. In some embodiments the path is the cheapest path based on the cost of the individual components that also matches some other set of criteria (e.g., that performs a particular set of operations on the data). Once a path is selected, the process 600 defines (at 645) configurations for the components of the selected path that (during a run-time of the IC) will cause the components to create the path.

The following sections provide a more detailed explanation of some embodiments. Section II describes the various connection matrices and the connections between components represented by each matrix. Section III describes computing probabilistic flow of data through various components using a matrix without self-loops and converting this probabilistic data flow into a probabilistic data flow that does include data flow through self-loops. Section IV describes calculating a cost for each component based on the probabilistic flow of data through the component and the number of inputs that the component has. Section V describes a computer design of a computer used to calculate II. Connection Matrices A. General 4D Connection Matrix 1. Determining the Connections The 4D connection matrix $M_4$ with elements $M_4(c, t, c', t')$ of some embodiments identifies relationships between components of the integrated circuit, both physically and temporally. Each value in the 4D connection matrix represents a connection (i.e., a connection uninterrupted by other components that are being considered as part of the calculations) between a component (c) at a given time (t) and a component (c') at a given time (t'). It is possible for both time t and time t' to be the same (e.g., for a component that passes data to another component without a delay of even one sub-cycle). It is also possible for the component c and component c' to be the same (e.g., for a component that sends a signal in one sub-cycle to be received by itself in a later sub-cycle). In some embodiments, the fraction $M_4(c, t, c', t')$ is calculated based on the number of available connections between the components.

Figure 7A:
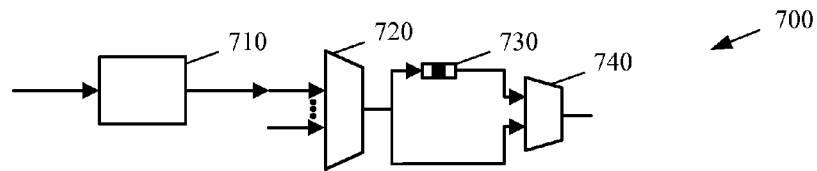
FIGS. 7A and 7B conceptually illustrate the identification of connections used in the generation of a 4D connection matrix.
Figure 7B:
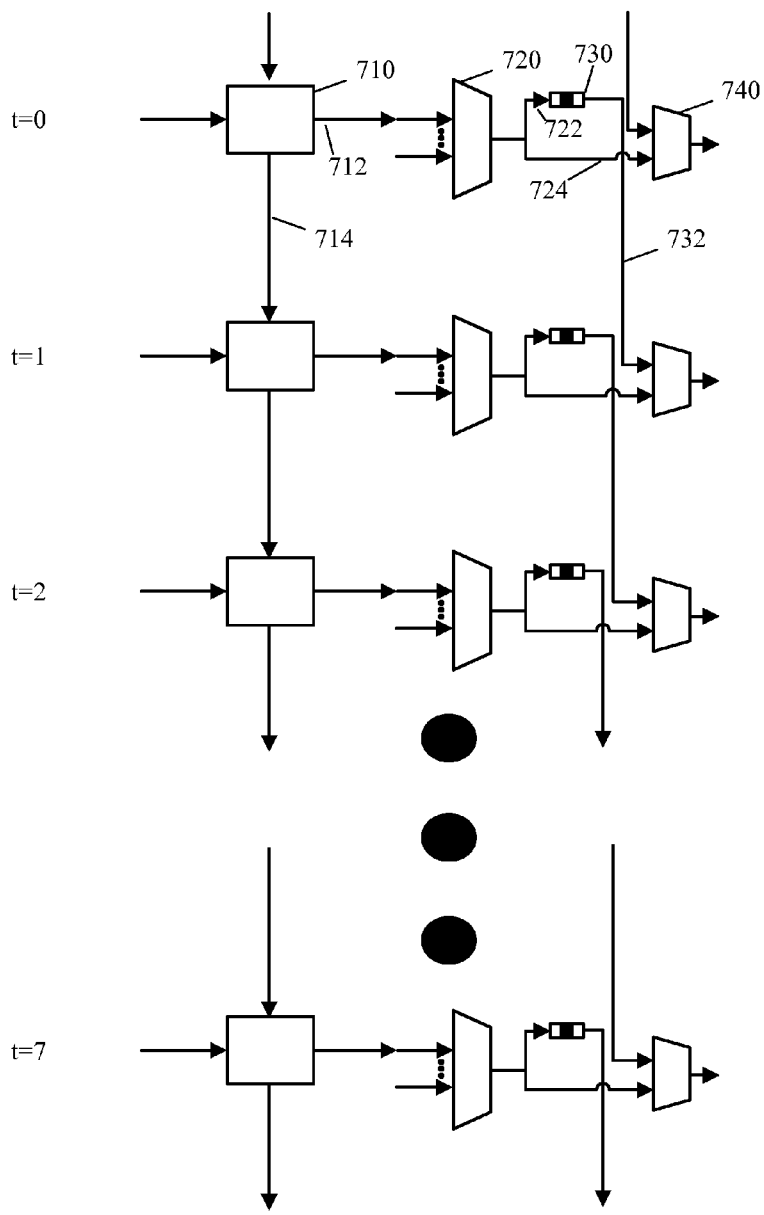

FIGS. 7A and 7B conceptually illustrate the identification of connections used in the generation of a 4D connection matrix. FIG. 7A includes a representation of the individual components of a system of components 700, along with the physical connections between them. The components include time via 710, a p-input MUX 720 (where p is a number more than two), a conduit 730, and a two-input MUX 740. FIG. 7B includes multiple components shown at multiple points of time (e.g., during multiple sub-cycles). FIG. 7B includes a representation of the available inputs and outputs of the individual components in eight sub-cycles (in the figure, sub-cycles t=0, t=1, t=2, and t=7 are shown explicitly, while sub-cycles t=3 to t=6 are represented by ellipsis in the figure) with the temporal components of the connections illustrated.

The time via 710 receives data from a single input and then can either send the data to its physical output in the same sub-cycle (transparent configuration) or store the data until the next sub-cycle (storage configuration). The p-input MUX 720 receives data from up to p different sources on its p inputs and selects which data to pass to its output based on the configuration of the MUX. Whichever input of the MUX 720 is selected, data from that input is provided at the output in the same sub-cycle in which it is received. The conduit 730 receives data from MUX 720 in each sub-cycle then, in the next sub-cycle, passes that data on to an input of the next component, MUX 740. Two-input MUX 740 receives data at its inputs and, based on the configuration of the MUX 740, passes data from the selected input to the output of the MUX 740 in the same sub-cycle as it is received.

In the space and time connection diagram in FIG. 7B, the components 710-740 are shown with their connections illustrated in time. In the first illustrated sub-cycle (t=0), time via 710 has an output 712 connected to an input of MUX 720 in the same sub-cycle. This output represents the configurable option for the time via 710 to transparently pass any data without delay. Time via 710 also has an output 714 to itself in the next sub-cycle (t=1). The time via's output 714 to itself in the next sub-cycle represents the configurable option for the time via 710 to store received data until the following sub-cycle.

MUX 720 has two output connections, 722 (to the conduit 730) and 724 (to the MUX 740), both in the same sub-cycle (t=0). The connections 722 and 724 are in the same sub-cycle because the MUX 720 connects its selected input and its output without a delay of even one sub-cycle. In contrast to the time via 710, the conduit 730 is not configurable to be transparent. Instead the conduit 730 automatically stores received data for one sub-cycle then passes it on through its output 732 to MUX 740 in the next sub-cycle.

As FIG. 7B also shows, in sub-cycle t=1, the same output options are available to the components, the outputs to the next sub-cycle go to components in sub-cycle t=2. In some embodiments, the possible connections are the same in every sub-cycle, with the delays looping back into the first sub-cycle t=0 after the last sub-cycle (here, t=7).

2. Calculating the 4D Matrix

In some embodiments, the flow is calculated backwards, from the output of a component to the input of that component to the output of the next component in turn. For example, 1/p of the inputs of MUX 720 is connected to the physical output 712 of time via 710. Accordingly, when calculating the flow backwards, 1/p of the flow coming through MUX 720 goes to time via 710.

To calculate the values of a 4D connection matrix for a set of components, some embodiments identify the number of inputs of each component. The numbers of inputs are identified as both the physical and temporal connections of each component. That is, the locations in space and time to which those inputs connect. The embodiments identify each space/time input as receiving an equal fraction of the flow from the component. For example, eqs. (1A)-(1E) show the non-zero values of the $M_4(c, t, c', t')$ matrix for the component arrangement in FIG. 7A for (backwards) data flow ending in sub-cycle t=0.

$$M_4(c,t,c',t')=M_4(0,0,1,0)=1/p \tag{1A}$$

$$M_4(c,t,c',t')=M_4(0,0,0,1)=1/2 \tag{1B}$$

$$M_4(c,t,c',t')=M_4(1,0,2,0)=1 \tag{1C}$$

$$M_4(c,t,c',t')=M_4(1,0,3,0)=1/2 \tag{1D}$$

$$M_4(c,t,c',t')=M_4(2,0,3,1)=1/2 \tag{1E}$$

In eqs. (1A)-(1E), component c=0 represents the time via 710, c=1 represents the MUX 720, c=2 represents the conduit 730, c=3 represents the MUX 740. In eq. (1A), p represents the number of inputs of MUX 720.

Eq. (1A) represents the connection from the time via 710 (c=0) to the MUX 720 (c'=1), both the output of data from time via 710 and the input of data to MUX 720 occur in sub-cycle t=t'=0. The (backwards) flow through the MUX 720 is defined in some embodiments to be split evenly among the inputs of the MUX 720. Accordingly, the fraction of the (backwards) flow from MUX 720 that reaches time via 710 is one divided by the number of inputs of the MUX 720, providing a matrix element of 1/p from the MUX 720 to the time via 710.

Eq. (1B) represents the connection from the time via 710 (c=0) in sub-cycle t=0 to itself (c'=0) in sub-cycle t=1. The time via 710 has one physical input and one temporal input in sub-cycle t=1. That is a total of two inputs. Accordingly, in embodiments that define the backward flow as being evenly split among the inputs of the component, half the backward flow goes through the physical input and half the backwards flow goes through the temporal input, providing a matrix element of ½ from the time via 710 to itself.

Eq. (1C) represents the connection from the MUX 720 (c=1) to the conduit 730 (c'=2), both the output of data from MUX 720 and the input of data to conduit 730 occur in sub-cycle t=t'=0. The conduit has only one input. Accordingly all of the backwards flow goes through that input, providing a matrix element of 1 from the conduit 730 to the IMUX 720.

Eq. (1D) represents the connection from the MUX 720 (c=1) to the MUX 740 (c'=3), both the output of data from MUX 720 and the input of data to MUX 740 occur in sub-cycle t=t'=0. The MUX 740 has two inputs, providing a matrix element of ½ from the MUX 740 to the MUX 720.

Eq. (1E) represents the connection from the conduit 730 (c=2) to the MUX 740 (c'=3), where the output of data from conduit 730 occurs in sub-cycle t=0. The input of data to MUX 740 occurs in sub-cycle t'=1. The MUX 740 has two inputs, providing a matrix element of 1/2.

The physical and temporal connections of the components 710-740 are the same in each sub-cycle. Therefore, the same 4D connection matrix elements will recur for data originating in sub-cycle t=1, t=2, . . . t=7 etc. Other than the recurring connections, there are no connections that directly link two components more than one sub-cycle apart and no connections linking other pairs of components than the ones shown in eqs. (1A)-(1E). Therefore, the matrix elements for other values of c, c', t, and t' (e.g., $M_4(1, 1, 1, 2)$) are zero. Although the illustrated embodiment shows a total of 8 sub-cycles, one of ordinary skill in the art will understand that in some embodiments more or fewer sub-cycles are used (e.g., for ICs with looperness of more or less than 8).

B. Steady Flow 3D Connection Matrix

The recurrence of matrix elements in different sub-cycles allows a simplification of the matrix in some embodiments. The probabilistic flow of data, in some embodiments, is defined to be in a steady state. That is, the flow through a component does not vary with time. This is shown in eq. (2)

$$f(c,t)=f(c) \tag{2}$$

In eq. (2), f(c, t) represents the flow of data through component c as a function of time and f(c) represents the steady flow of data through component c. In some embodiments f(c, t) is calculated using matrix $M_4$. In other embodiments, f(c) is calculated using simplified matrices.

Although the flow through each component at any given time is defined to be constant, data still takes time to go between some components of such embodiments. Accordingly, in some such embodiments, differences in time (i.e., dt, as shown in eq. (3), below) affect the values of the 4D connection matrix but actual times of data leaving the components are not necessary for a connection matrix to fully describe the connections between components.

$$dt=t-t' \quad (3)$$

In eq. (3), t is the time that data leaves an output of component c after passing through component c. t' is the time data leaves an output of component c' after passing through component c'.

In embodiments that define the flow to be in a steady state, the 4D connection matrix $M_4$, with elements $M_4(c, t, c', t')$ can be replaced, with no loss of information, by a 3D connection matrix, $M_3$, with elements $M_3(c, c', dt)$. $M_3$ in some embodiments is an n-by-n-by-(m+1) matrix, where "n" represents the total number of components being considered and "m" represents the maximum number of sub-cycles between any component sending a signal and any directly connected component receiving that signal. The 3D connection matrix, $M_3(c, c', dt)$ identifies the fractions of the connections between the components and other components in various different sub-cycles. For example, if component 1 (c=1) receives half the flow of component 2 (c'=2), with a delay of four sub-cycles (dt=4) after component 2 sent the flow, then $M_3(1, 2, 4)=1/2$. Similarly, if component 1 (c=1) receives a quarter of the data flow from itself (c'=1), with a delay of two sub-cycles (dt=2) after sending the data flow (e.g., through a loop back that takes 2 sub-cycles), then $M_3(1, 1, 2)=1/4$.

Figure 8:
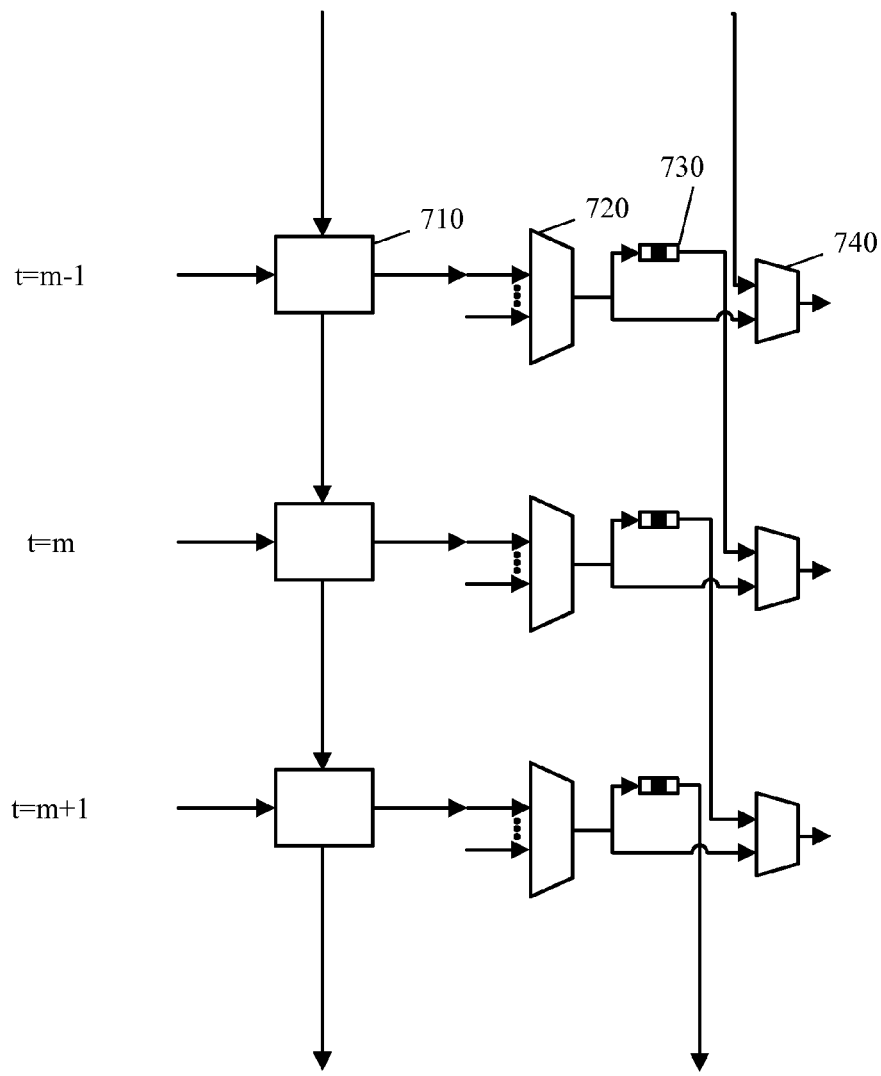
FIG. 8 conceptually illustrates the identification of connections used in the generation of a steady state 3D connection matrix.

FIG. 8 conceptually illustrates the identification of connections used in the generation of a steady state 3D connection matrix in some embodiments. In each sub-cycle (t=m), the time via 710 potentially receives data from itself in the previous sub-cycle (t=m−1) and potentially sends data to the MUX 720 in the same sub-cycle (t=m) and to itself the next sub-cycle (t=m+1). Similarly, the conduit 730 sends data to the MUX 740 in the next sub-cycle (t=m+1). The longest delay for a connection (dt=m) in the steady state matrix is one sub-cycle. There are 4 components being considered. Accordingly, the n-by-n-by-(m+1) matrix is a 4-by-4-by-2 matrix. The two layers of the 4-by-4-by-2 matrix can be written as two 4-by-4 matrices: one 4-by-4 matrix $M_3(dt=0)$ showing connections in the same sub-cycle and one 4-by-4 matrix $M_3(dt=1)$ showing connections to the next sub-cycle. These 4-by-4 matrices are shown in eqs. (4A) and (4B)

$$M_3(dt=0) = \begin{pmatrix} 0 & 1/p & 0 & 0 \\ 0 & 0 & 1 & 0.5 \\ 0 & 0 & 0 & 0 \\ 0 & 0 & 0 & 0 \end{pmatrix} \quad (4A)$$

$$M_3(dt=1) = \begin{pmatrix} 0.5 & 0 & 0 & 0 \\ 0 & 0 & 0 & 0 \\ 0 & 0 & 0 & 0.5 \\ 0 & 0 & 0 & 0 \end{pmatrix} \quad (4B)$$

In eqs. (4A) and (4B), component c=0 represents the time via 710, c=1 represents the MUX 720, c=2 represents the conduit 730, c=3 represents the MUX 740. In eq. (4A), the term 1/p represents the inverse of the number of inputs of the MUX 730. The rows of the matrices in eqs. (4A) and (4B) represent constant c values in $M_3(c, c', dt)$, while the columns of the matrices represent constant c' values in $M_3(c, c', dt)$. The matrix $M_3$ is simpler than matrix $M_4$, but can be simplified further.

C. Steady Flow 2D Connection Matrix

The flow for a steady state 3D connection Matrix (e.g., 3 variable matrix $M_3$) with a particular number of components is easier to compute than the flow for a non-steady state 4D connection Matrix (e.g., 4 variable matrix $M_4$) with the same number of components. However, in some embodiments further simplifications are performed in order to further decrease the computing costs for probabilistic data flows through the components. In some embodiments, a 2D connection matrix is generated by eliminating the temporal component of the 3D matrix. The 2D connection matrix does not include information about the sub-cycle in which data flows from a component (c) to a component (c'). The 2D connection matrix includes information about what fractions of data are sent from component (c) to component (c') over all sub-cycles.

In some embodiments the 2D connection matrix $M_{2A}$ with elements $M_{2A}(c, c')$ is generated by summing the 3D connection matrix $M_3(c, c', dt)$ over time. In other words, such embodiments add the corresponding elements from eqs. (4A) and (4B), above, to generate eq. (5).

$$M_{2A} = \begin{pmatrix} 0.5 & 1/p & 0 & 0 \\ 0 & 0 & 1 & 0.5 \\ 0 & 0 & 0 & 0.5 \\ 0 & 0 & 0 & 0 \end{pmatrix} \quad (5)$$

FIG. 9 conceptually illustrates a graphical representation of the connections between the components identified by 2D connection matrix $M_{2A}$. In addition to the previously identified components, the figure includes connections 910 and 930. The simplification of the matrix from matrix $M_3$ to matrix $M_{2A}$ renders connections between components independent of sub-cycles. For the connections that were already within one sub-cycle this results in no change to the component diagram. However, the connections from components in one sub-cycle to components in other sub-cycles have changed. Connection 910 does not go from time via 710 in one sub-cycle to time via 710 in another sub-cycle. Instead, the connection 910 loops back from the time via 710 to itself. Similarly, connection 930 does not go from conduit 730 in one sub-cycle to MUX 740 in another sub-cycle. Instead, the connection 930 goes straight to MUX 740. The connections in FIG. 9 are 2D representations of the 3D connections of FIGS. 7A-8, just as the matrix elements $M_{2A}(c, c')$ are 2D representations of the 4D matrix elements of eqs. (1A)-(1E), and the 3D matrix elements of eqs. (4A), and (4B).

D. Matrices without Self-Loops

In some embodiments, still further simplification is performed on the 2D matrix. Some such embodiments remove self-loops (data flow from a component to that same component) before calculating the flow $f_{2C}$ of data through the components. Some such embodiments generate matrices that identify the proportion of the data that flows from a component to other components, but not back to the same component. Some embodiments calculate the 2D matrix, $M_{2B}$, without self-loops by (1) starting with the elements of the 2D matrix, $M_{2A}$, with self-loops, (2) setting the diagonal (e.g., self-loop) elements to zero and (3) adjusting each other element relating to flow from a component with a self-loop to redistribute the proportion of the data flow that goes to the self-loop. Other embodiments remove any connections that are part of self-loops from the representation of the components and generate matrix $M_{2B}$ without generating the matrix $M_{2A}$ at all.

FIG. 10 conceptually illustrates a graphical representation of the connections between the components identified by 2D connection matrix without self-loops, $M_{2B}$. The figure includes the temporal connection, but does not include self-loops. Accordingly, the figure still includes connection 930, a connection based on temporal connection 732 from FIG. 7B, but excludes connection 910, which is a self-loop. Eq. (6) shows the new 2D connection matrix without self-loops.

$$M_{2B} = \begin{pmatrix} 0 & 1/p & 0 & 0 \\ 0 & 0 & 1 & 0.5 \\ 0 & 0 & 0 & 0.5 \\ 0 & 0 & 0 & 0 \end{pmatrix} \quad (6)$$

The elements $M_{2B}(c, c')$ of matrix $M_{2B}$ can be computed by starting with the elements $M_{2A}(c, c')$ of matrix $M_{2A}$, setting the diagonal elements, $M_{2A}(c', c')$, (i.e., elements which represent self-loops) of the matrix to zero and using eq. (7) to calculate each of the other elements for any component that had a self-loop (i.e., any elements in matrix $M_{2A}$ in the same column as a non-zero diagonal element). Eq. (7) effectively distributes the fractional flow through a self-loop to the other connections.

$$M_{2B}(c,c')=M_{2A}(c,c')/(1-M_{2A}(c',c')) \quad (7)$$

Each column of matrix $M_{2B}$ represents the fractions of data that has entered a particular component that flows out (backward) to other components. The entries in the third and fourth columns add up to one, indicating that flow is neither lost (fractions add up to less than 1) nor gained (fractions add up to more than 1) through the corresponding components. That is, the flow that is going out through the inputs of the corresponding components of the third column (the conduit 730) and the fourth column (MUX 740) is all remaining in the system of components being considered (i.e., components 710-740). However, in the first and second columns, the fractions do not add up to 1, indicating that flow is being lost through the inputs of the corresponding components. Flow is being lost through those inputs because the components to which they are connected are outside the set of components being considered. Some embodiments modify the connection matrix to account for the lack of identified components on those inputs and on the output of MUX 740.

E. Matrices Describing Fan-in Free and Fan-Out Free Components

A system of components includes inputs and outputs of those components. As mentioned above, components being considered are a set of components selected to be evaluated together and may include the components of a tile, some or all components of multiple tiles, or all components of an IC. The fractions of data flow through each considered component to all the other components being considered are represented by the matrices described herein. The 2D matrices include one row for each component being considered and one column for each component being considered. In some embodiments, not all the components of an IC are considered at the same time (i.e., represented by in a single matrix) because the computational time to consider all components of the IC at the same time would be prohibitive. Therefore, in some embodiments, in addition to the inputs and outputs that connect to other components under consideration, there are also inputs and outputs that connect to components outside the set of components being considered. For example, the inputs or outputs may connect to components that are outside of a tile or region of an IC being considered.

A component with no considered component connected to its output is defined herein to be "fan-out free". Similarly, a component with no identified component connected to its input is defined herein to be "fan-in free". These fan-out free and fan-in free components leave the matrix $M_{2B}$ unable to generate a steady flow unless the fan-out and fan-in free components are accounted for. When the fan-out free and fan-in free components are not accounted for, any initially assigned flow to the components "leaks" out through the unconnected components. Similarly, in some embodiments, the method must account for components that are not fan-out or fan-in free, but do have one or more inputs or outputs that connect to components outside the scope of the calculations. For example, in FIG. 7A, MUX 720 has 1 input connected to time via 710 and the other p−1 inputs connected to components outside the scope of the calculation.

Components that have all inputs connected to component(s) under consideration are called "full fan-in" components herein. Components that have all outputs connected to component(s) under consideration connected to a component under consideration are called "full fan-out" components herein. Components that have at least one fan-in connected to a component under consideration but not all fan-ins connected to a component under consideration are called "partial fan-in" components herein. Components that have at least one fan-out connected to a component under consideration but not all fan-outs connected to a component under consideration are called "partial fan-out" components herein. In some embodiments, some components can be any combination of fan-in types and fan-out types.

The preceding figures and matrices do not account for the data that flows (backward) out of the system or for data to flow (backward) into the system. In some embodiments, while calculating a steady flow, some embodiments split up any data flow out of the system of components through "unconnected" inputs (e.g., the input of the time via 710 of FIG. 7A and p−1 inputs of the MUX 720) among the outputs of the system of components (e.g., the output of the MUX 740 of FIG. 7A). In such embodiments, the matrix $M_{2B}$ is adjusted to generate matrix $M_{2C}$ shown in eq. (8). Matrix $M_{2C}$ conserves flow so that any probabilistic data flow that flows out of the system through an input that is not connected to a component under consideration flows back into the system through an output that is similarly not connected to a component under consideration.

$$M_{2C} = \begin{pmatrix} 0 & 1/p & 0 & 0 \\ 0 & 0 & 1 & 0.5 \\ 0 & 0 & 0 & 0.5 \\ 1 & 1-1/p & 0 & 0 \end{pmatrix} \quad (8)$$

Figure 12:
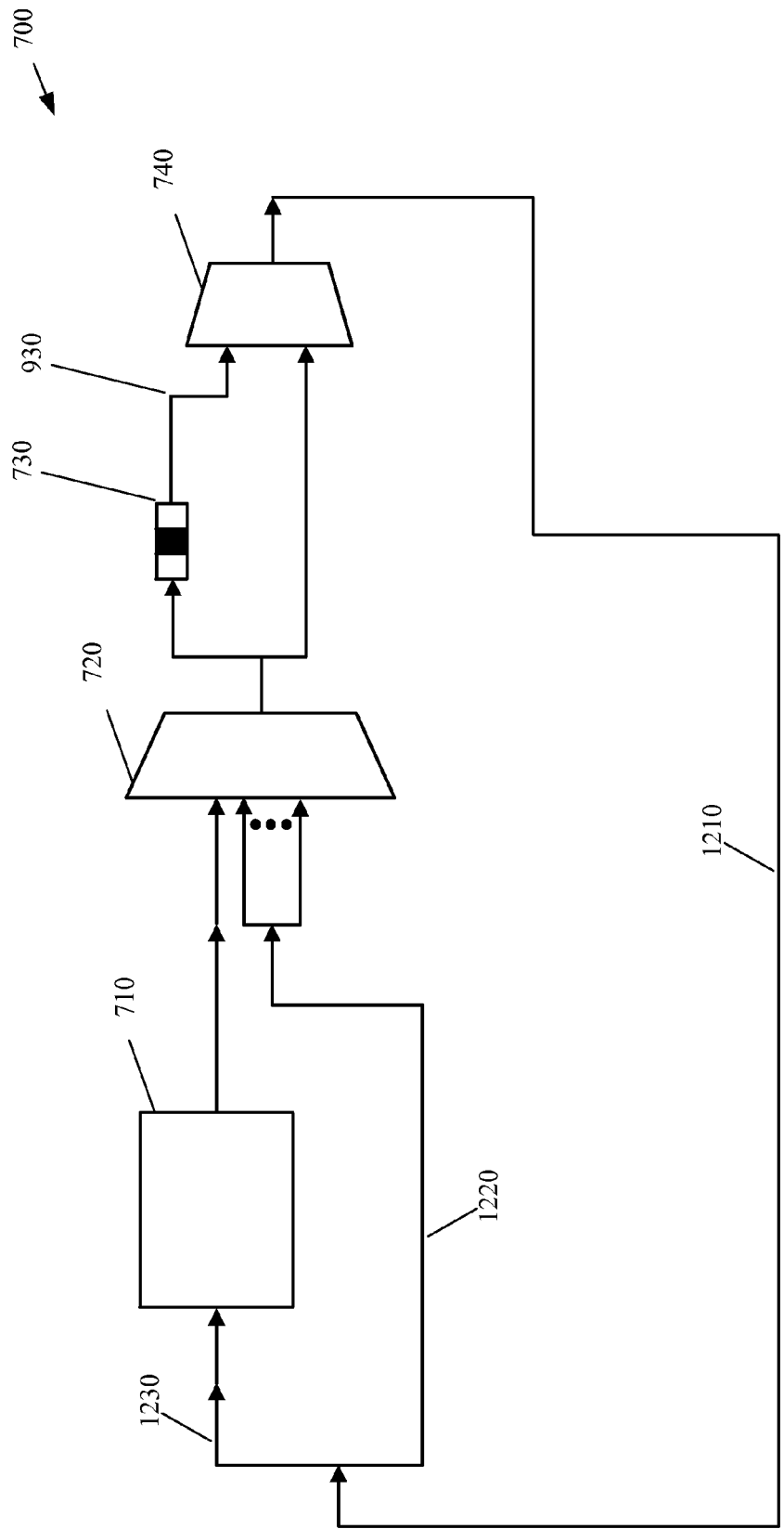
FIG. 12 conceptually illustrates the calculated connections from a fan-out free component to fan-in free components.

FIG. 12 conceptually illustrates the calculated connections from a fan-out free component to fan-in free components. FIG. 12 includes connections 1210-1230. Connection 1210 goes from the output of MUX 740 and splits into connections 1220 and 1230. Connection 1220 provides input to all inputs except one input of MUX 720. Connection 1230 provides input to time via 710. In embodiments where the probabilistic data flow is calculated as going backwards, these connections 1210-1230 allow data to flow out through the physical input of time via 710 and the unconnected (to identified components) inputs of MUX 720.

In eqs. (6) and (8), the lower left corners of the matrices $M_{2B}$ and $M_{2C}$, respectively represent the fraction of data flowing (backward) out of the input of time via 710, and into the output of MUX 740. Physically, there is no direct connection between the input of the time via 710 and the output of the MUX 740, which is why the element in the lower left corner of matrix $M_{2B}$ is 0. However, as conceptually illustrated in FIG. 10, some embodiments treat the components as though they were connected. In the adjusted matrix $M_{2C}$, all of the data flowing through time via 710 flows out to MUX 740. Accordingly, the lower left element of matrix $M_{2C}$ is 1. This signifies that all of the data flowing out of the input of time via 710 is flowing considered as flowing into the MUX 740.

MUX 720 is not fan-in free as it has an input connected to the output of the time via 710, which is one of the components under consideration. However MUX 720 does have p−1 inputs that are not connected to inputs of other components under consideration. Accordingly, without accounting for those additional inputs, a backwards data flow through the inputs loses data at the additional p−1 inputs. The probabilistic data flow is assumed to be uniformly shared among the p inputs. The data flow through each input is 1/p. The data flow through the p−1 additional inputs is therefore shown in eq. (9)

$$\text{Flow through } p-1 \text{ inputs} = (p-1)/p = 1 - 1/p \qquad (9)$$

In eq. (9), p is the number of inputs of MUX 720. Because the probabilistic data flow through the p−1 additional inputs is $(1-1/p)$ times the flow through the MUX 720, the last element of the second column of matrix $M_{2C}$ is $1-1/p$. As $M_{2C}$ is a matrix with columns whose elements are all non-negative and sum to 1, $M_2$ is a matrix that conserves the total amount of flow when applied to a 2D flow $f_{2C}$. Accordingly, matrix $M_2$ can be used to compute a steady state probabilistic flow of data through the components being considered. One of ordinary skill in the art will understand that while some embodiments perform each of the above described operations, then determine the matrix $M_{2C}$ based on one or more of the previously defined matrices $M_4$, $M_3$, $M_{2A}$, and $M_{2B}$, other embodiments directly calculate a matrix $M_2$ based on the types of components and the number of physical connections between them. For example, in some embodiments, the "unattached" outputs of components under consideration are treated as looped back to the "unattached" inputs of the components under consideration and the entire $M_{2C}$ matrix is generated based on the physical connections without considering self-loops at all.

One of ordinary skill in the art will recognize matrix $M_2$ as a left stochastic matrix, i.e., a square matrix of non-negative real numbers with each column summing to 1. As such, a multiplication by the matrix, applied to any vector (a vector representing a probabilistic flow of data in each component) will conserve the total amount of flow.

III. Computing Probabilistic Data Flow in Components

A. Computing Probabilistic Data Flow without Self-Loops

When a configurable circuit is in use, data passes through the components of the circuit in discrete bundles, called "bits". It is possible however to treat the components and the connections between them as pathways for a probabilistic flow of data when the actual amounts of data that will flow through the connections and components is unknown. In such a probabilistic data flow, the flow splits where connections branch and combines where connections come together.

Once a matrix $M_{2C}$ has been calculated, either directly from the component layout or from other matrices, some embodiments use the matrix $M_{2C}$ to compute a self-consistent probabilistic flow of data. A self-consistent flow is a steady state flow that remains the same when the matrix is applied to it. Different embodiments use different methods to compute a self-consistent flow. In some embodiments, a vector comprising a (backward) flow of 1 for each fan-out free component and a flow of 0 for each other component is generated. For the system of components 700, such a vector is shown in eq. (10).

$$f_2 = \begin{pmatrix} 0 \\ 0 \\ 0 \\ 1 \end{pmatrix} \qquad (10)$$

As was the case with matrix $M_{2C}$, the fourth row of flow vector $f_2$ represents the MUX 740. As MUX 740 is the only component that is fan-out free in component system 700, it is the only component with an initial flow. The first three rows, representing the time via 710, the MUX 720, and the conduit 730, respectively, have no initial flow because they are not fan-out free and are thus not assigned any initial flow in some embodiments. To demonstrate the breadth of the applicability of the process to different types of components, the number of inputs of p-input MUX 720 has been left as a variable until now. However, for ease of calculations, p is assumed to be 4 from this point on. One of ordinary skill in the art will understand that some embodiments can be applied to MUXs with different numbers of inputs and that the number of inputs of an actual circuit being evaluated will be known when the connection matrix is determined. When the matrix $M_{2C}$ is applied repeatedly to the initial flow vector $f_2$, the flow converges to a final flow vector shown in eq. (11).

$$f_{2C} = \lim_{k \to \infty} M_{2C}^k f_2 = \lim_{k \to \infty} \begin{pmatrix} 0 & 1/4 & 0 & 0 \\ 0 & 0 & 1 & 0.5 \\ 0 & 0 & 0 & 0.5 \\ 1 & 1-1/4 & 0 & 0 \end{pmatrix}^k \begin{pmatrix} 0 \\ 0 \\ 0 \\ 1 \end{pmatrix} = \frac{1}{11} \begin{pmatrix} 1 \\ 4 \\ 2 \\ 4 \end{pmatrix} \qquad (11)$$

In eq. (11), the matrix $M_{2C}$ is applied to a flow vector $f_2$ that has elements with a value of 1 representing each fan-out free component and elements with a value of 0 representing each other component. Eq. (11) shows that when matrix $M_{2C}$ (with p=4) is applied repeatedly to the initial flow vector, the flows through the elements converge on a steady state flow vector $f_{2C}$ in which 1/11th of the total data flow is though the time via 710, $4/11^{th}$ of the total data flow is through the p-input MUX 720, $2/11^{th}$ of the total data flow is through the conduit 730, and $4/11^{th}$ of the total flow is through the 2-input MUX 740. Mathematically, eq. (11) would result in the same steady state flow vector $f_{2C}$ for any initial flow vector with a total flow of 1, though the number of iterations necessary to converge to a steady state may vary. Accordingly, some embodiments, calculate $M_{2C}^k$ (for some large value of k and apply the resulting matrix to any starting vector with a desired total starting flow. The programs of other embodiments start with a given vector and apply the matrix $M_{2C}$ to the original vector and then apply $M_{2C}$ to the resulting vectors repeatedly until the result converges on a steady state.

Figure 11:
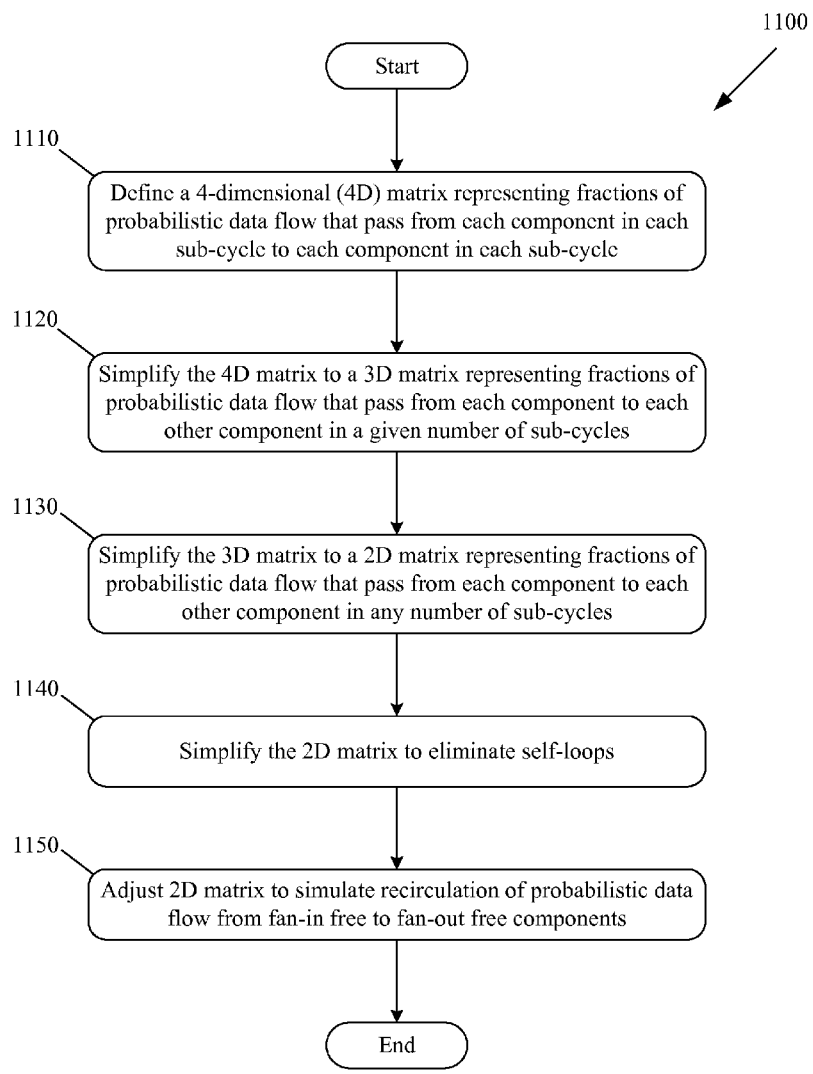
FIG. 11 conceptually illustrates a process of some embodiments for generating a simplified 2D matrix with recirculation $M_{2C}$.

FIG. 11 conceptually illustrates a process 1100 of some embodiments for generating a simplified 2D matrix with recirculation $M_{2C}$. The process 1100 begins by defining (at 1110) a 4-dimensional (4D) matrix $M_4$ with elements $M_4$(c, t, c', t') representing the connections between the components. In some embodiments, the process 1100 defines (at 1110) the 4D matrix by identifying components in a set of components being considered and identifying the connections between the components in given sub-cycles. FIG. 7A, above, illustrates a set of components that help define a 4D matrix $M_4$. FIG. 7B conceptually illustrates an example of the arrangement of components in multiple sub-cycles and connections between the components that define the 4D matrix $M_4$. The process 1100 then simplifies (at 1120) the 4D matrix $M_4$ to a 3D matrix $M_3$ with elements $M_3(c, c', dt)$ representing fractions of probabilistic data flow that pass from each component to each other component in a given number of sub-cycles (dt). FIG. 8 conceptually illustrates a set of components in multiple sub-cycles and connections between the components in the multiple sub-cycles that the matrix $M_3$ represents. The process 1100 starts with matrix $M_4$ and simplifies the matrix $M_4$. However, some embodiments directly generate a matrix $M_3$ by identifying such components and connections rather than starting with an actual matrix $M_4$ and simplifying that matrix.

The process 1100 then simplifies (at 1130) the 3D matrix $M_3$ to a 2D matrix $M_{2A}$ with elements $M_{2A}(c, c')$. The matrix $M_{2A}$ may include self-loops if any of the considered components send data to themselves in a different sub-cycle. FIG. 9, above, conceptually illustrates a set of components, including a component with a self-loop, that are represented by a matrix $M_{2A}$. The process 1100 calculates a matrix $M_3$ and simplifies the matrix $M_3$ itself. However, some embodiments directly generate a matrix $M_{2A}$ by identifying such components and connections rather than calculating an actual matrix $M_3$ and simplifying that matrix.

The process 1100 then simplifies (at 1140) the 2D matrix $M_{2A}$, with self-loops, to a 2D matrix $M_{2B}$ with elements $M_{2B}(c, c')$ with all diagonal elements equal to zero. The matrix $M_{2B}$ does not include self-loops. FIG. 10, above, conceptually illustrates a set of components without any self-loops that are represented by a matrix $M_{2B}$. The process 1100 calculates a matrix $M_{2A}$ and simplifies the matrix $M_{2A}$ itself. However, some embodiments directly generate a matrix $M_{2B}$ by identifying such components and connections rather than calculating an actual matrix $M_{2A}$ and simplifying that matrix.

The process 1100 then adjusts (at 1150) the 2D matrix $M_{2B}$, with self-loops, to a 2D matrix $M_{2C}$ with elements $M_{2C}(c, c')$ with all diagonal elements equal to zero and with the values of either each rows or each column summing to 1 (a stochastic matrix). The matrix $M_{2C}$ includes terms that recirculate and thus conserve probabilistic data flow. FIG. 12, above, conceptually illustrates a set of components with connections linking the fan-in free components and the fan-out free components that are represented by a matrix $M_{2C}$.

Figure 13:
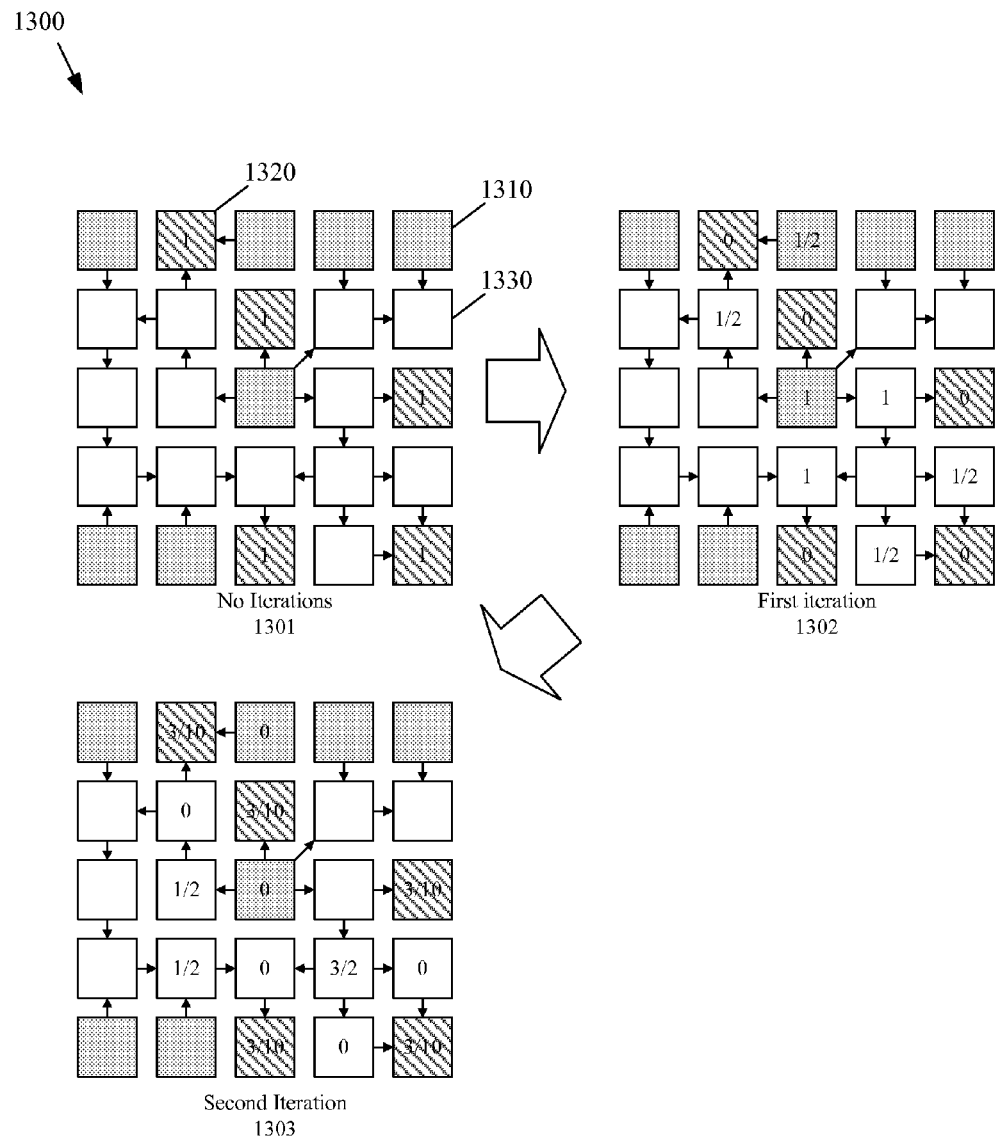
FIG. 13 conceptually illustrates the flow of data through a set of components over multiple iterations of a connection matrix.

FIG. 13 conceptually illustrates the flow of data through a set of components 1300 over multiple iterations of a connection matrix. The figure is shown in three stages, stage 1301 (no iterations), stage 1302 (first iteration), and stage 1303 (second iteration). The connection matrix for the illustrated set of 25 components is a 25×25 matrix. For brevity, the matrix itself is not shown herein. The figure includes fan-in free components 1310 (shown as gray squares), fan-out free components 1320 (shown as striped squares), and components 1330 (shown as white squares) with full fan-in and full fan-out. In the first stage 1301, flow values of 1 are assigned to each of the fan-out free components 1320. All other flow values are assigned as 0 (shown as a lack of a number for simplicity). In the second stage 1302, the flow in each fan-out free component 1320 has left the component for the connected components. In each case, the (backward) flow has been split evenly among the components whose outputs connect to the inputs of the fan-out free components 1320. For instance, the initial flow (one) from the uppermost fan-out free component 1320 has been divided into flows of ½ each for its connected components.

In the third stage 1303 the flow has moved further along the connections of the set of components 1300. In some embodiments, it is possible for flow from multiple components to enter a single component. For example, in the component second from the right and second from the bottom, the (backward) flow from multiple components has entered a single component, giving it a flow of more than 1. One of ordinary skill in the art will understand that the flows are relative flows and 1 is not the maximum possible flow through a component. Also in the third stage 1303, the flow that had been in fan-in free components 1310 (i.e., a net flow of 1½), has been divided among the five fan-out free components 1320. The division of the flow in the fan-in free components 1310 among the fan-out free components results in a flow of 3/10 in each fan-out free component 1320. Due to the recirculation of the flow in the fan-in free components to the fan-out free components the total flow remains 5 in the third iteration. The total flow is the same in each iteration. The unchanging total flow demonstrates that the total flow is conserved in each iteration.

Sufficient iterations to reach a steady state are not shown. However, one of ordinary skill in the art will understand that after a sufficiently large number of iterations, the flow through the components will converge on a steady state. After that state is reached, further iterations will not change the flow through each of the components.

While the above described embodiment uses a matrix $M_{2C}$ that has been simplified to eliminate self-loops before adding in elements to recirculate (backward) data flow from fan-in free and partial fan-in sites, some embodiments use matrix $M_{2A}$, with self-loops, modified to include elements that recirculate the data to generate a matrix $M_{2D}$. Some of these embodiments use matrix $M_{2D}$ to determine the flow $f_{2D}(c)$ through each component c. Eq. (12) shows the results of using such a matrix to determine a steady state flow through the components.

$$f_{2D} = \lim_{k \to \infty} M_{2D}^k f_2 = \lim_{k \to \infty} \begin{pmatrix} 1/2 & 1/4 & 0 & 0 \\ 0 & 0 & 1 & 0.5 \\ 0 & 0 & 0 & 0.5 \\ 1/2 & 1-1/4 & 0 & 0 \end{pmatrix}^k \begin{pmatrix} 0 \\ 0 \\ 0 \\ 1 \end{pmatrix} = \frac{1}{12}\begin{pmatrix} 2 \\ 4 \\ 2 \\ 4 \end{pmatrix} \quad (12)$$

B. Computing Probabilistic Data Flow with Self-Loops

As previously described, one of the simplifications of the connection matrices was the removal of self-loops when going from matrix $M_{2A}$ to matrix $M_{2B}$ (before generating matrix $M_{2C}$). Determining a steady state flow under connection matrix $M_{2C}$ yields a flow vector $f_{2C}$. However, in some embodiments, the cost of a component is calculated based on the probabilistic flow of data through the component, including flow that goes through self-loops. Accordingly, some embodiments calculate a flow $f_{2D}$ through components that include the flow through self-loops. In some embodiments, the flow through the self-loops of components with self-loops does not affect the flow through components without self-loops. Therefore the flow through components without self-loops remains the same when determining $f_{2D}$. This is shown in eq. (13).

$$f_{2D}(c) = f_{2C}(c) \quad (13)$$

In eq. (13), c represents a component without a self-loop. For components with a self-loop, some embodiments calculate the flow through the self-loop as a particular fraction of the total flow through the component. Eq. (14) shows the fraction of some embodiments.

$$q = r/p \quad (14)$$

In eq. (14), q represents the fraction of the flow $f_{2D}$ through a component that flows through the self-loop(s), p represents the total number of inputs, including self-looping inputs of the component with self-loop(s) and r represents the number of self-looping inputs to the component (e.g., if the component has one self-loop that returned in 2 sub-cycles and one self-loop that returned in 4 sub-cycles, then r=2). Accordingly, such embodiments use the relationships between the flows in eq. (15A), simplified in eq. (15B) to calculate $f_{2D}(c)$ for components with self-loops.

$$q*f_{2D}(c) + f_{2C}(c) = f_{2D}(c) \quad (15A)$$

$$f_{2D} = f_{2C}/(1-q) \quad (15B)$$

Eq. (15A) represents the initial assumption of some embodiments, namely that flow through self-loop(s) plus the calculated flow through the other inputs (i.e. $f_{2C}$) equals total flow through the component with self-loop(s). Among the components described herein, only the time via has a self-loop, and it has only one physical input. However, one of ordinary skill in the art will understand that some embodiments calculate flows for components with self-loops other than time vias.

Figure 14B:
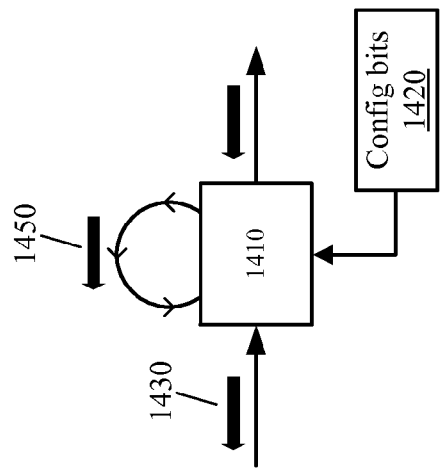
FIG. 14B illustrates the flow through a time via when self-loops are considered.
Figure 14A:
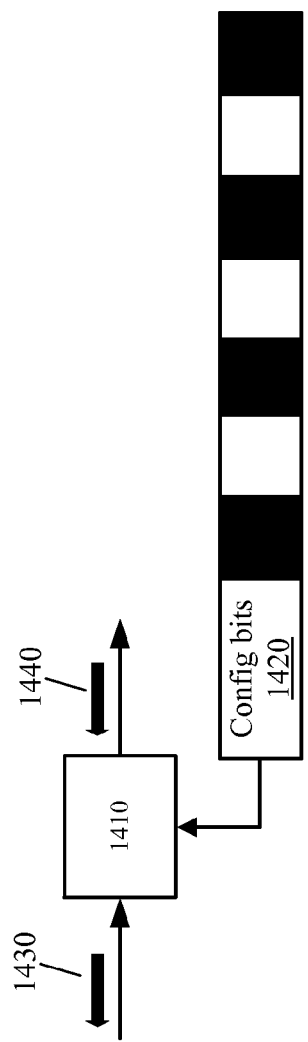
FIG. 14A illustrates the flow through a time via when self-loops are not considered.

FIG. 14A illustrates the flow through a time via when self-loops are not considered. The figure includes time via 1410, configuration bits 1420, output flow 1430, and input flow 1440. The configuration bits 1420 determine whether the time via 1410 is set to store data (looping the data back to the time via 1410) or pass data transparently (sending data from output to input). In this figure, the time via 1410 is considered to have one input and one output. Accordingly, the output flow 1430 is the same as the input flow 1440. FIG. 14B illustrates the flow through a time via when self-loops are considered. In the figure, self-loop flow 1450 is shown along the loop leaving and entering time via 1410. In some embodiments, the total flow into (and out of) the time via 1410, including the flow in the self-loop, is calculated by applying appropriate value for q as shown in eq. (16), into the conversion formula of eq. (15B), above.

The results of the application are shown as eq. and (17).

$$q = r/p = 1/2 \quad (16)$$

$$f_{2D}(\text{time via}) = f_{2C}(\text{time via})/(1 - 1/2) = 2 * f_{2C}(\text{time via}) \quad (17)$$

In eq. (16), r is the number of self-loops of the time via (one), p is the total number of inputs including self-loops (two, one physical, one self-loop), q is the fraction of the inputs that are self-loops. In eq. (17), the flow conversion formula of equation (15B) is applied and some embodiments determine that the total flow $f_{2D}$(time via) through the time via 1410 is twice the calculated non-self-loop flow $f_{2C}$(time via).

The above described embodiment assumes an equal probabilistic data flow through each input of the time via (i.e., the spatial and temporal inputs) and one temporal input (a self-loop). However, other embodiments have uneven distribution of the flow among the temporal and spatial inputs or allow multiple inputs representing time delays of different numbers of sub-cycles.

C. Process of Computing Probabilistic Flow

Figure 15:
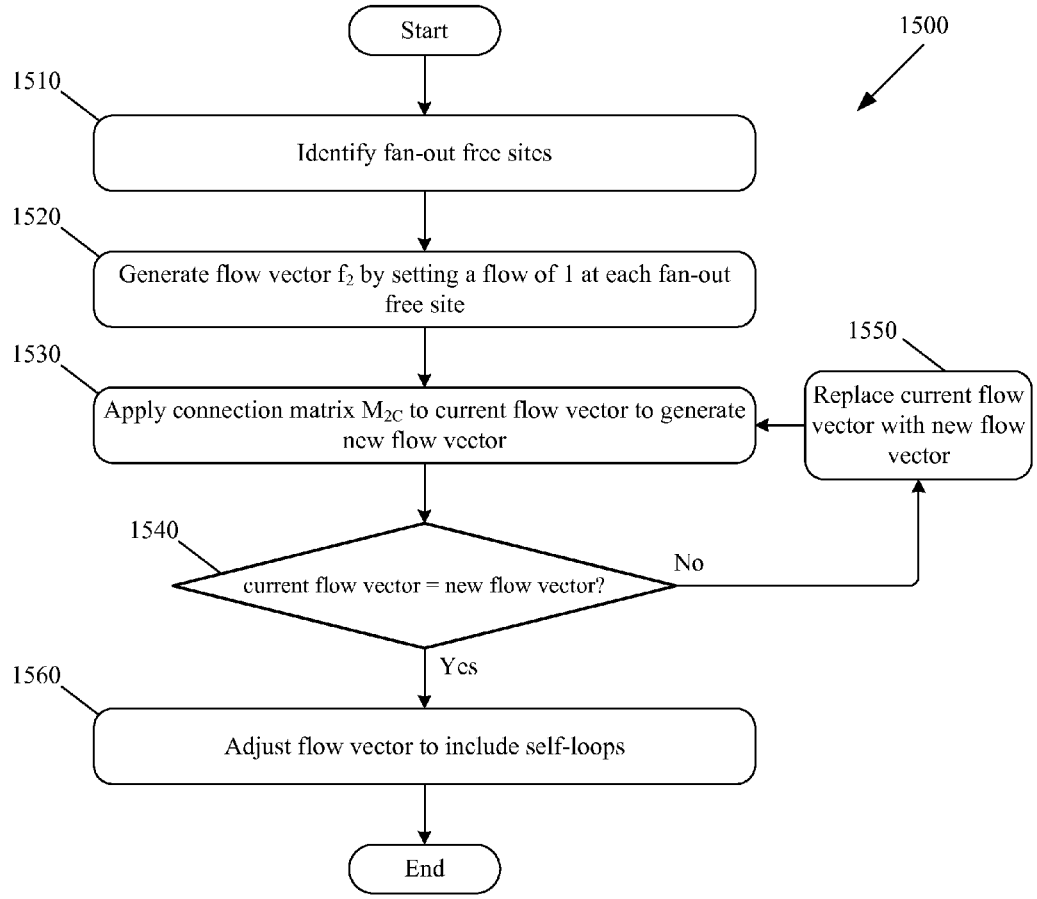
FIG. 15 conceptually illustrates a process of some embodiments for calculating a steady state flow with self-loops.

The above sections III.A and III.B describe how some embodiments calculate a steady state probabilistic data flow that includes self-loops. FIG. 15 conceptually illustrates a process 1500 of some embodiments for calculating a steady state flow with self-loops. As shown, the process identifies (at 1510) fan-out free sites. However in some embodiments the fan-out free sites have previously been identified when generating the matrix $M_{2C}$. In some such embodiments the identification is maintained and operation 1510 is skipped. In FIG. 13, above, examples of fan-out free sites are shown as striped squares 1320. The process 1500 then generates (at 1520) an initial flow vector $f_2$ by setting a flow of 1 at each fan-out free site. An example of an initial flow vector is found in eq. 10, above. Another example is graphically represented by the number 1 in each of the striped boxes in FIG. 13, above.

The process 1500 then applies (at 1530) the connection matrix $M_{2C}$ to the current flow vector. The process 1500 then determines (at 1540) whether the current flow vector is equal to the new flow vector. In some embodiments the process 1500 determines whether the current flow vector is within a threshold value (or a threshold fraction) of the new flow vector, rather than determining whether the two values are actually identical. When the current and new flow vectors are not equal (or nearly equal in some embodiments) the process 1500 replaces the (at 1550) the current flow vector with the new flow vector and then repeats the application (at 1530) of the connection matrix $M_{2C}$ to the then current flow vector. An example of the first two iterations of the application of a connection matrix $M_2$ is shown in FIG. 13, above. The application of the connection matrix to the current flow vector is repeated, until the conditions of the determination (at 1540) are met at which point the flow is considered to be in a steady state. The steady state flow vector identifies the flow through each component as an element of the vector.

The process 1500 then adjusts (at 1560) the flow vector to include self-loops. Some embodiments use the computations described in section III.B to adjust the flow vector. Once a flow vector that includes the flows through self-loops has been calculated, the process 1500 ends.

IV. Computing Costs of Components

A. Individual Components

In some embodiments, the cost of a path (set of components assigned to work together) is determined by the amount of probabilistic data flow blocked by the use of each component from use by other paths. In some embodiments, the cost is equal to or proportional to the flow blocked by the use of the component for a particular path. However, in some embodiments the cost of a component is smaller than the total amount of flow through the component, because some of the flow through a path site also flows through adjacent path sites. In such embodiments, counting the portion of flow through a component that also flows through other components of the path would be double counting and would make the path cost more than it otherwise should. In some such embodiments, the cost of a component is calculated using eq. (18).

$$\text{cost}(c) = f_{2D}(c) * (p(c) - 1)/p(c) \quad (18)$$

In eq. (18), the cost(c) represents the cost of component c, $f_{2D}(c)$ represents the total flow through the component, including self-loops, and p(c) represents the number of inputs (including self-loop inputs) of the component. Thus the cost (c) represents the portion of the flow of the component that would otherwise flow to inputs that are not on the path. For a MUX with many inputs, the cost is almost as great as the total flow, because the MUXs use in one particular path cuts it off from being part of many other possible paths.

As an example of calculating the cost, the cost of a p-input MUX relative to the flow into the MUX is calculated in eq. (19)

$$cost(MUX) = f_{2D}(MUX) * (p-1)/p \qquad (19)$$

In eq. (19), the cost of using a MUX with a large number of inputs (p≫1) is approximately the same as the total flow through the MUX. In contrast, the cost of using a MUX with only two inputs is half the flow through the MUX. In each case, the cost represents the amount of flow that is blocked by using that MUX in the path.

As another example of calculating the cost, the cost of a time via relative to its flow is calculated in eq. (20)

$$cost(\text{time via}) = f_{2D}(\text{time via}) * (2-1)/2 = f_{2D}(\text{time via})/2 \qquad (20)$$

In eq. (20), $f_{2D}$(time via), represents the total probabilistic flow of data through the time via, cost(time via) represents a calculated cost for using the time via in a particular path. In some embodiments, the cost of a component is a cost per sub-cycle. If a path of such embodiments occupies a component for more than one sub-cycle, then the total cost of using that component in that path is the cost per sub-cycle of the component, times the number of sub-cycles in which the component is used by that path. For example, the cost of using a time via to store data for dt sub-cycles is shown in eq. (21)

$$cost(\text{time via for } dt \text{ sub-cycles}) = cost(\text{time via}) * (1+dt) \qquad (21)$$

In eq. (20), dt is the number of sub-cycles for which a time via stores data while being used is used in a path. Accordingly 1+dt is the number of cycles in which the path uses the time via. For example, if dt is 1, the time via stores data for one sub-cycle. Accordingly, the time via is occupied for the sub-cycle it receives the data and for the next sub-cycle in which it releases the data (a total of two sub-cycles). Therefore, the cost of storing data in a time via for one sub-cycle is twice the cost of using it as a pass-through (where dt is zero).

In contrast to a component with multiple inputs, a conduit has only one input. The result of the conduit having a single input is that there is no split in the (backwards) data flow from the conduit. Accordingly, the conduit can only be a part of the path of whatever component is connected to the input of the conduit. Therefore, no other possible path (other than the path the conduit is actually a part of) is being blocked by selecting the conduit for the same path as the component connected to the input of the conduit. Therefore, the cost for a conduit is zero.

B. Subgraphs

In some embodiments, the connection matrices are simplified still further to reduce computing time. The simplification reduces a particular subset of the components being considered (the subset is sometimes called a "subgraph") to a single component for the purposes of calculating the flow into the subgraph. Once the flow into the subgraph is calculated, the known relationships of flows among the components of the subgraph is used to determine the cost of each component of the subgraph without having to put each component separately into the connection matrix.

In some embodiments, the total amount of flow entering and leaving a part of the path with one fan-in and one fan-out is the same. If the costs of the individual elements in relation to that total amount of flow are known, then the subgraph is collapsible into an atomic (single component) site with a known cost per total flow.

Figure 16:
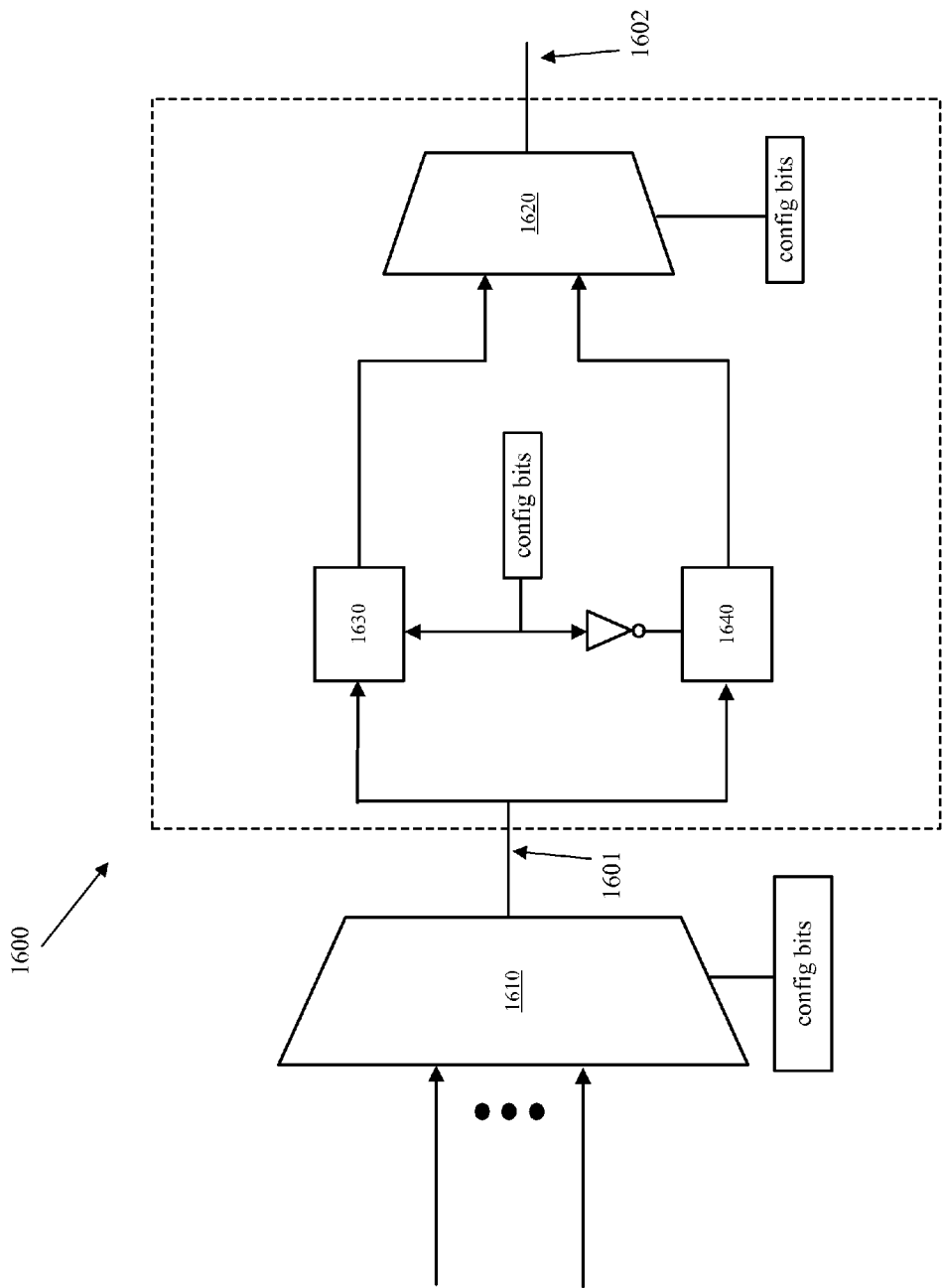
FIG. 16 illustrates a subgraph that has a fan-in of one and a fan-out of one.

FIG. 16 illustrates a subgraph 1600 that has a fan-in of one and a fan-out of one. The figure include subgraph 1600, with fan-out 1601 and fan-in 1602 and MUX 1610. Together the MUX 1610 and the components of subgraph 1600 make up a combination of components called a "YMUX". A YMUX is a type of group of components that is used in the ICs of some embodiments. The YMUX includes a MUX 1610 that provides an input from one of multiple sources. The particular source of the input depends on the configuration bits that configure MUX 1610. The output of MUX 1610 is then sent to two time vias 1630 and 1640 that have opposite configurations. During any given sub-cycle, one of the time vias 1630 and 1640 is transparent (input to the time via is available at the output within the same sub-cycle it is received) and the other time via is latched (outputting the data value that was at the input when the configuration went from transparent to latched. The outputs of each time via 1630 and 1640 are connected to the inputs of MUX 1620. MUX 1620 outputs the data received from one of the time vias 1630 or 1640. Which time via's data is passed to the output of the MUX 1620 depends on the configuration of MUX 1620. The subgraph 1600 has three components: MUX 1620 and time vias 1630 and 1640. The flow into and out of the subgraph in some embodiments is determined by taking the subgraph as a single component in a connection matrix $M_2$ and determining a flow through each component (or subgraph) of the components/subgraphs being considered.

Figure 17:
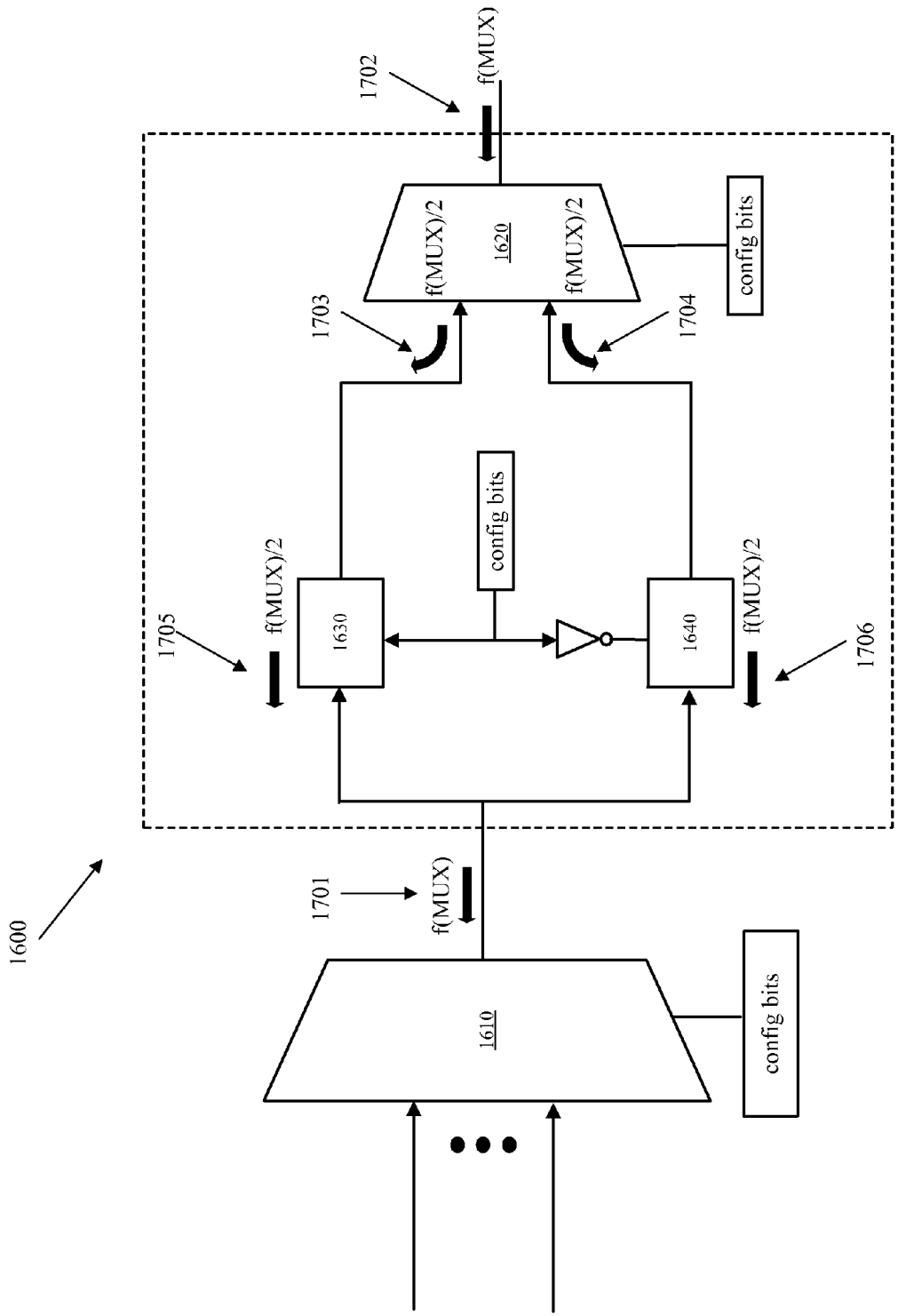
FIG. 17 illustrates the flow without self-loops in each component of a subgraph.

FIG. 17 illustrates the flow without self-loops in each component of a subgraph. The figure includes the flow 1701 out of subgraph 1700, flow 1702 into subgraph 1700, and flows 1703-1706 within the subgraph. The total flow 1701 into the subgraph and flow 1702 out of the subgraph 1600 is the same amount as the total flow through the MUX 1620. Upon leaving MUX 1620, the flow 1702 is split between the two inputs of the MUX 1620. The flows 1703 and 1704 through the inputs of the MUX 1620 are calculated to be equal in some embodiments. Therefore the flows 1703 and 1704 are calculated to each be half the amount of the flow 1702. The amount of flows 1703 and 1704 are also the flows into the time via 1630 and 1640. In a steady state, the flows 1705 and 1706 out of the time vias 1630 and 1640 are equal to the flows 1703 and 1704 into the time vias 1630 and 1640. The flows 1705 and 1706 then rejoin to become flow 1701, the flow out of the subgraph.

Figure 18:
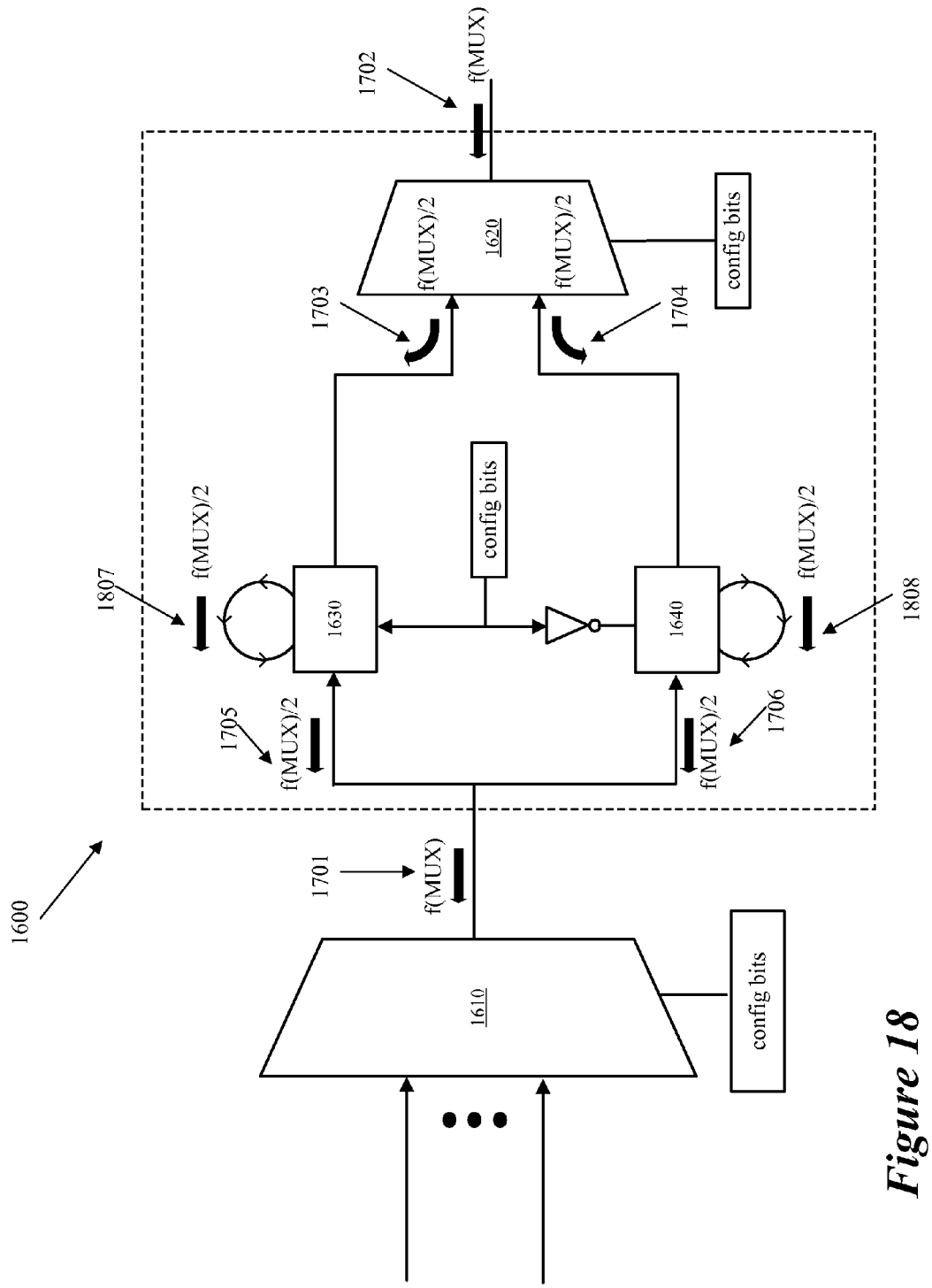
FIG. 18 illustrates the flow through components of a subgraph including self-loops.

As described above, the cost of a component is calculated based on the total flow through the component, rather than the cost without self-loops. Accordingly, some embodiments calculate the total flow, including self-loop flow, through each component before calculating the cost. FIG. 18 illustrates the flow through components of a subgraph including self-loops. The only components in the subgraph 1600 with self-loops are the time vias 1630 and 1640. The flows 1807 and 1808 through the self-loops are assumed in some embodiments to be the same as the flows 1705 and 1706 through the outputs of the time vias 1630 and 1640. The total flow through time via 1630 is the sum of the flows 1705 and 1807. The total flow through time via 1640 is the sum of the flows 1706 and 1808. The total flow through each time via is therefore the same as the flow 1702 into the MUX 1620. As shown in eq. (22)

$$f_{2D}(\text{time via}) = f_{2D}(MUX)/2 + f_{2D}(MUX)/2 = f_{2D}(MUX) \qquad (22)$$

The cost for a MUX with a given flow was calculated in eq. (19). The cost for a time via was previously calculated in eqs. (20) and (21). Using the subgraph 1600 for a path that occupies only one of the 2 time vias in the process, the total cost of the subgraph 1600 is therefore the sum of the costs of the components. The total cost for subgraph 1600 is shown in eqs. (23A)-(23F).

$$\text{Cost(subgraph)} = cost(\text{time via for } dt \text{ sub-cycles}) + cost(MUX) \qquad (23A)$$

$$\text{Cost(subgraph)}=\text{cost(time via)}*(1+dt)+f_{2D}(\text{MUX})*(p-1)/p \quad (23B)$$

$$\text{Cost(subgraph)}=f_{2D}(\text{time via})*(1+dt)/2+f_{2D}(\text{MUX})*(2-1)/2 \quad (23C)$$

$$\text{Cost(subgraph)}=f_{2D}(\text{time via})*(1+dt)/2+f_{2D}(\text{MUX})/2 \quad (23D)$$

$$\text{Cost(subgraph)}=f_{2D}(\text{MUX})*(1+dt)/2+f_{2D}(\text{MUX})/2 \quad (23E)$$

$$\text{Cost(subgraph)}=f_{2D}(\text{MUX})*(1+dt/2) \quad (23F)$$

Eqs. (23A)-(23F) determine a conversion factor, (1+dt/2), which converts a flow $f_{2D}$(MUX) determined by a connection matrix that assumes the subgraph is a single component and turns that flow into a cost for using the subgraph to store data over dt sub-cycles.

C. Cost of a YMUX

Some embodiments identify subgraphs that are not one fan-in/one fan-out. For example, some embodiments consider the entire cost for using a set of components that are often grouped together, even if that set of components has more than one input. One such group of components YMUX, mentioned above and illustrated in FIG. 16. Such embodiments calculate not only the cost of the subgraph 1600 with its single input and single output, but also calculate the cost of the MUX 1610 that supplies input to the subgraph 1600.

Figure 19:
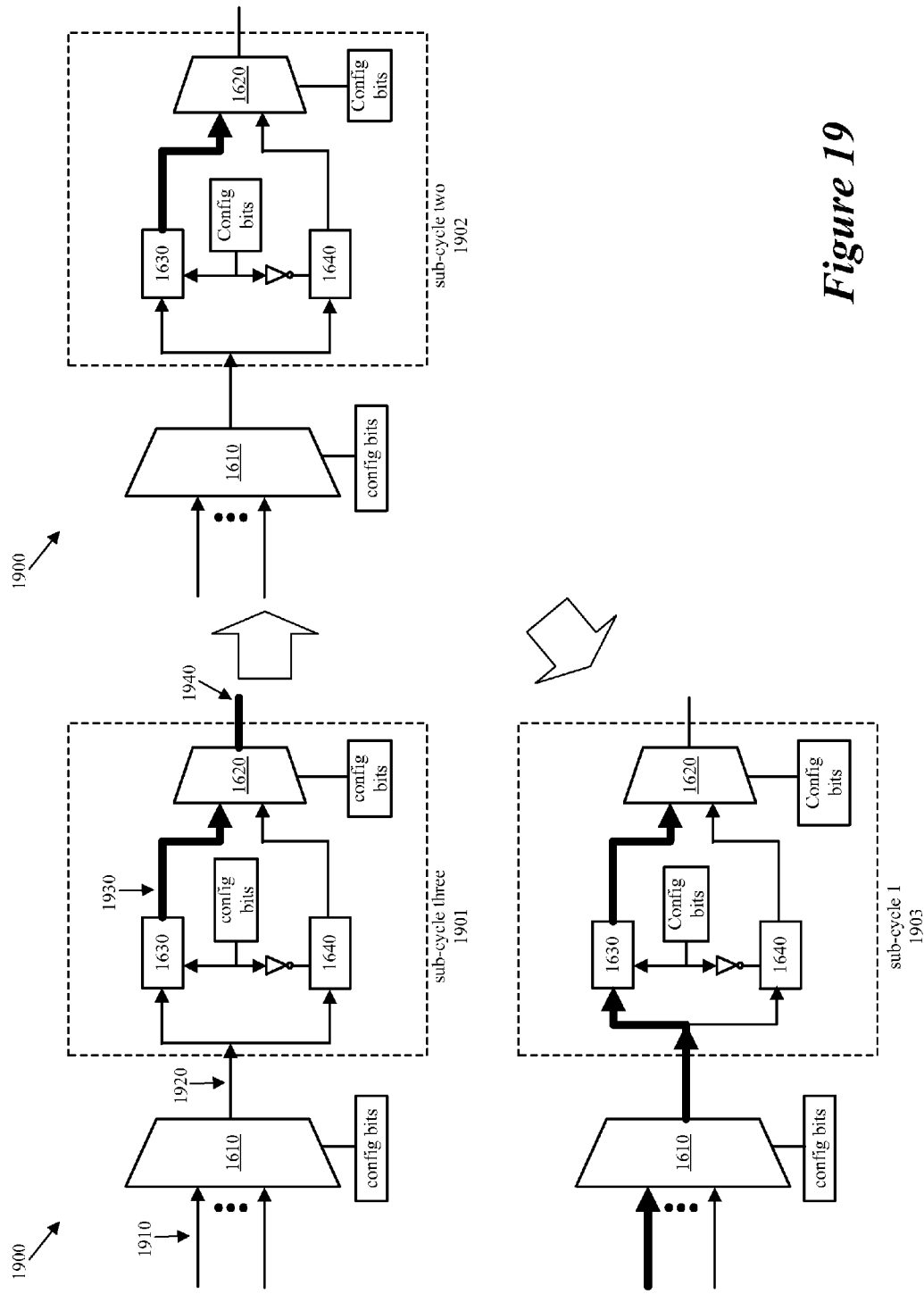
FIG. 19 conceptually illustrates the (backward) flow of data through a YMUX.

FIG. 19 conceptually illustrates the (backward) flow of data through a YMUX 1900. The figure is shown in 3 stages, sub-cycle three 1901, sub-cycle two 1902, and sub-cycle one 1903. Each stage represents a particular sub-cycle in the operation of the YMUX 1900. The stages are in reverse order of the sub-cycles in order to indicate that the probabilistic data flow is being calculated backward. The figure includes input 1910 and outputs 1920-1940. The figure shows (by widening the arrow from the output of a component to the input of the next component) which outputs are occupied by the data on a path through the YMUX 1900 in different sub-cycles. The components with the occupied outputs are unavailable for other data. Therefore, the cost of the path includes the cost of the components in each sub-cycle in which their outputs are occupied. FIG. 19 represents a YMUX 1900 receiving a signal at input 1910 of MUX 1610 in sub-cycle one 1903. The MUX 1610 passes that signal on to output 1920, which stores the signal for a time, providing a delay of two sub-cycles (dt=2) until sub-cycle three 1901, at which time the time via 1630 passes the signal to the MUX 1620. In some embodiments, the flow is calculated backward, it is described below in terms of both backward and forward flow.

In sub-cycle three 1901, data (calculated as flowing backwards) arrives at output 1940 of MUX 1620. The MUX 1620 is configured the send data from its upper input to its output 1940. In some embodiments, (forward) data flow out of a MUX takes place in the same sub-cycle as the data is received. Accordingly, the output 1930 of the time via 1630 is occupied in sub-cycle three 1901, just as the output of the MUX 1940 is occupied in sub-cycle three 1901. Considered in the forward flow direction, the time via 1630 outputs its data to the MUX 1620 and MUX 1620 passes the data to its output in sub-cycle three 1901.

In sub-cycle two 1902, the time via 1630 is storing the data, so the output 1930 of the time via 1630 is unavailable for use by any other path during this sub-cycle two 1902. Accordingly, output 1930 is shown as wider than usual. In sub-cycle two 1902, the only component occupied by the path is time via 1630. The MUX 1610 is available to receive other data and pass it through to the MUX 1620 along the time via 1640 which is configured to be transparent and MUX 1620 is available to pass that data to output 1940.

In sub-cycle one 1903, the data flows (backward) from the input of the time via 1630 to the output 1920 of the MUX 1610. The MUX 1610 passes the data to one of its inputs, specifically input 1910. Considered in the forward flow direction, the MUX 1610 receives the data on input 1910 and passes the data through to time via 1630 through output 1920. In sub-cycle one 1903, the time via 1630 and the MUX 1610 are occupied, but the time via 1640 and the MUX 1620 are available to be used as part of another path.

Therefore, using YMUX 1900 for storing the data for 2 sub-cycles (dt=2, not including the receiving sub-cycle) occupies the time via 1630 for 3 sub-cycles (1+dt), the MUX 1620 for one sub-cycle and the MUX 1610 for one sub-cycle. Using a YMUX 1900 to store data this way therefore imposes a total cost that is the sum of the cost of the subgraph (shown in eq. 23F) and the cost of the MUX 1610 (which can be calculated using eq. (19)). Eqs. (24A)-(24E) show the total cost of the YMUX.

$$\text{cost(YMUX)}=\text{cost(subgraph)}+\text{cost(MUX 1610)} \quad (24A)$$

$$\text{cost(YMUX)}=f_{2D}(\text{MUX})*(1+dt/2)+f_{2D}(\text{MUX 1610})*(p-1)/p \quad (24B)$$

$$\text{cost(YMUX)}=f_{2D}(\text{MUX})*(1+dt/2)+f_{2D}(\text{MUX})*(p-1)/p \quad (24C)$$

$$\text{cost(YMUX)}\approx f_{2D}(\text{MUX})*(2+dt/2) \quad (24D)$$

$$\text{cost(YMUX)}\approx f_{2D}(\text{MUX})*3 \quad (24E)$$

In going from eq. (24B) to eq. (24C) the flow $f_{2D}$(MUX 1610) is the same as the flow into the subgraph 1600, as described above. The approximation of eq. (24D) holds if the number of inputs p of MUX 1610 is large. If the number of inputs p is small, then the approximation of eq. (24D) does not hold. In the example of FIG. 19, the time via 1630 held the data for 2 sub-cycles (dt=2), therefore the total cost of the YMUX is approximately 3 times the value of the (backward) flow into the YMUX as shown in eq. (24E).

D. Cost of a KMUX

A YMUX is not the only commonly repeated set of components of some embodiments that can be used for storing data for a given number of sub-cycles. In some embodiments a set of components collectively called a KMUX can store data from one sub-cycle to the next then, either once or repeatedly, pass that data back to itself and store the data for another sub-cycle.

Figure 20:
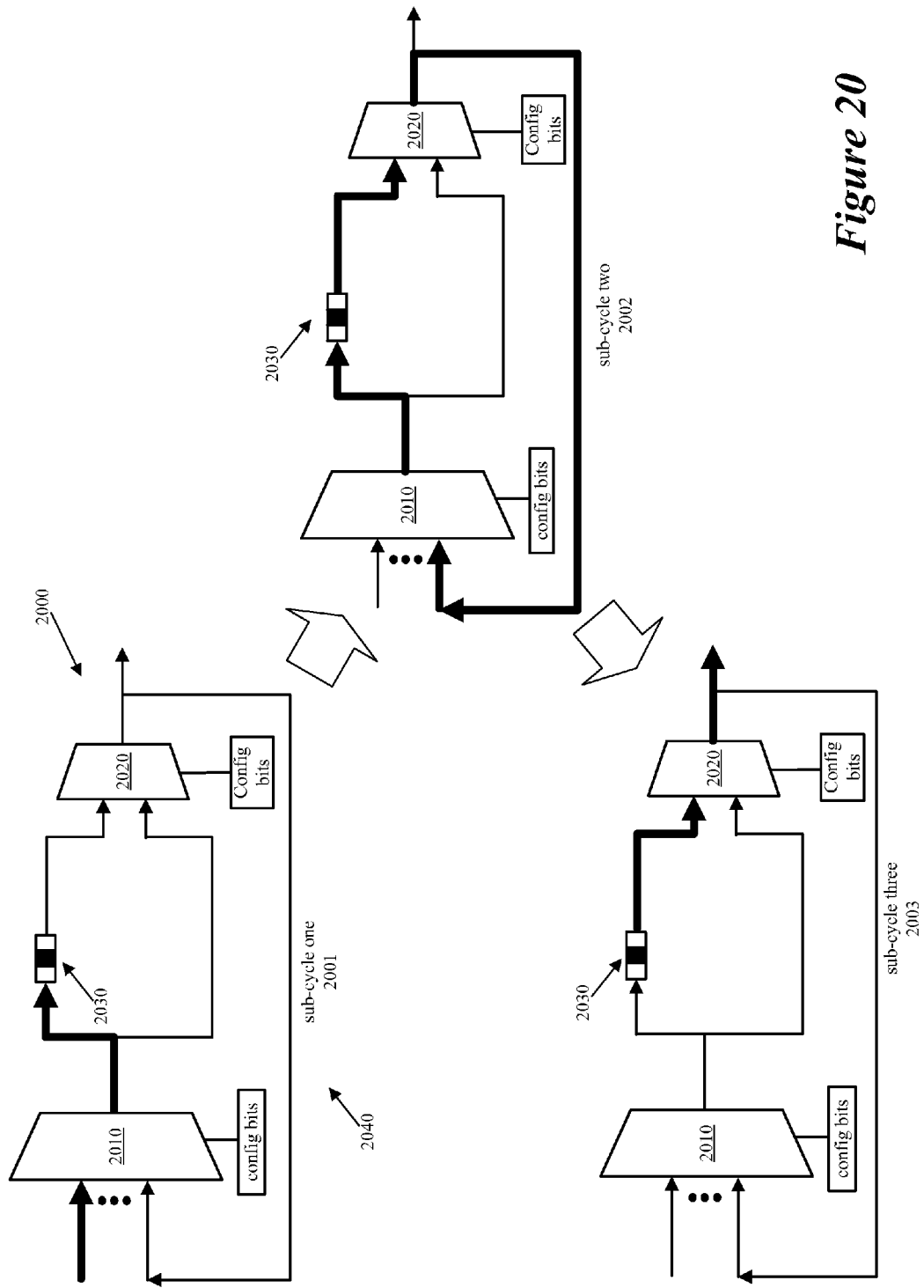
FIG. 20 illustrates a KMUX of some embodiments storing data for 2 sub-cycles (dt=2).

FIG. 20 illustrates a KMUX 2000 of some embodiments storing data for 2 sub-cycles (dt=2). For simplicity, the KMUX 2000 is described with a forward flow of data, though in some embodiments the probabilistic flow of data is calculated as a backward flow of data. FIG. 20 is shown in three stages, sub-cycle one 2001, sub-cycle two 2002, and sub-cycle three 2003. FIG. 20 includes KMUX 2000, made up of MUXs 2010 and 2020, and conduit 2030. The conduit 2030 receives data in one sub-cycle then passes that data on in the next sub-cycle. The output of the MUX 2010 branches into the conduit and a direct connection with an input of MUX 2020. If MUX 2020 uses the input with the direct connection, then data passes through the KMUX 2000 in the same sub-cycle it arrives in. A KMUX 2000 can therefore pass data directly within the same sub-cycle or delay the data by one sub-cycle, depending on the configuration of the MUX 2020.

In some embodiments the KMUX 2000 is physically connected back to itself by a connection 2040 that splits off from the output of the MUX 2020 and connects to one of the inputs of the MUX 2010 (this is an actual connection, rather than a connection assumed for calculation purposes). In such embodiments, the KMUX 2000 can store data for longer than one sub-cycle by looping the data back to itself to be delayed by conduit 2030 in the next sub-cycle. FIG. 20 illustrates a KMUX 2000 providing a delay of two sub-cycles (dt=2) by looping data back. In sub-cycle one 2001, MUX 2010 receives data on an input and passes the data to the conduit 2030. The conduit 2030 takes data and delays it one sub-cycle, therefore the data received from MUX 2010 will not be output until sub-cycle two 2002. The output of the conduit 2030 could be supplying data from an earlier sub-cycle, i.e., on a different path than the path of the data received by the MUX 2010 in sub-cycle one 2001. Accordingly, of the outputs of the components, only the output of the MUX 2010 is occupied in sub-cycle one 2001.

In sub-cycle two 2002, the conduit 2030 provides an output of the data it received in the previous sub-cycle. The output is received by the MUX 2020, which immediately passes the output to an input of MUX 2010. The MUX 2010, is configured in this sub-cycle to receive the data from MUX 2020. Therefore MUX 2010 again sends the data to conduit 2030. In this sub-cycle, all three components 2010-2030 are occupied.

In sub-cycle three 2003, the data is passed from conduit 2030 to MUX 2020, but is no longer looped back to MUX 2010. In this sub-cycle, the conduit 2030 and the MUX 2020 are occupied.

There are three relevant types of sub-cycles in the storage time of a KMUX 2000, (1) starting sub-cycle, (2) ending sub-cycle and (3) intermediate sub-cycles. In general, in the sub-cycle in which data arrives at a KMUX 2000, the MUX 2010 is occupied. In the sub-cycle in which data leaves the KMUX (assuming the conduit is used at all, so there is a delay of at least one sub-cycle), the conduit 2030 and the MUX 2020 are occupied. In the intermediate sub-cycles (if any) all three components 2010-2030 are occupied. The number of intermediate sub-cycles is one less than the number of sub-cycles delay. So for a delay of one sub-cycle, there are no intermediate sub-cycles and each component is used once, for a total cost shown in eqs. (25A)-(25D)

$$\text{cost(KMUX)}=\text{cost(MUX 2010)}+\text{cost(MUX 2020)}+\text{cost(conduit)} \qquad (25A)$$

$$\text{cost(KMUX)}=f_{2D}(\text{MUX 2010})*(2-1)/2+f_{2D}(\text{MUX 2020})*(p-1)/p+0 \qquad (25B)$$

$$\text{cost(KMUX)}=f_{2D}(\text{MUX})/2+f_{2D}(\text{MUX})*(p-1)/p \qquad (25C)$$

$$\text{cost(KMUX)} \approx f_{2D}(\text{MUX})*(3/2) \qquad (25D)$$

In eq. (25B) the flow through each MUX is multiplied by a factor determined by the number of inputs of that MUX. As described above in sub-section VI.A., the conduit has no cost because it has only one input. Accordingly the cost of the conduit in eq. (25B) is zero. The split outputs of the MUX 2010 converge on the MUX 2020. The convergence of all the output paths from MUX 2010 into MUX 2020 mean that the flow out of the MUX 2010 is calculated as being the same as the flow out of the MUX 2020 in some embodiments. Accordingly, in eq. (25C) the flows are assumed to be the same and rewritten as $f_{2D}(\text{MUX})$. The approximation in eq. (25D) assumes that the number of inputs p of the MUX 2020 is large.

For a path where the lower input of the MUX 2020 is used, there is no delay by the conduit, but the MUXs 2010 and 2020 are both used. Since in the other case, where the conduit is used, the conduit has a cost of zero, the total cost of the KMUX remains the same for passing data through a KMUX in the same cycle as for passing data through the KMUX with a delay of one sub-cycle.

For a path where the delay is greater than one sub-cycle, all three components are used in each additional sub-cycle, leading to a cost per sub-cycle that is the same as the cost shown in eq. (25C) and approximated in eq. (25D). The cost (and approximate cost) for a delay of dt sub-cycles (where dt is greater than 1) is shown in eqs. (26A) and (26B).

$$\text{cost(KMUX)}=[f_{2D}(\text{MUX})/2+f_{2D}(\text{MUX})*(p-1)/p]*dt \qquad (26A)$$

$$\text{cost(KMUX)} \approx f_{2D}(\text{MUX})*(3/2)*dt \qquad (26B)$$

E. Cost of a Low Power Sub-Cycle Reconfigurable Conduit

Some clocked storage elements operate at the rate of a sub-cycle clock. These clocked storage elements consume power unnecessarily when performing operations that do not require data throughput at sub-cycle rate. Therefore, some embodiments provide a clocked storage element that consumes less power when performing low-throughput operations that do not require sub-cycle rate.

Figure 21:
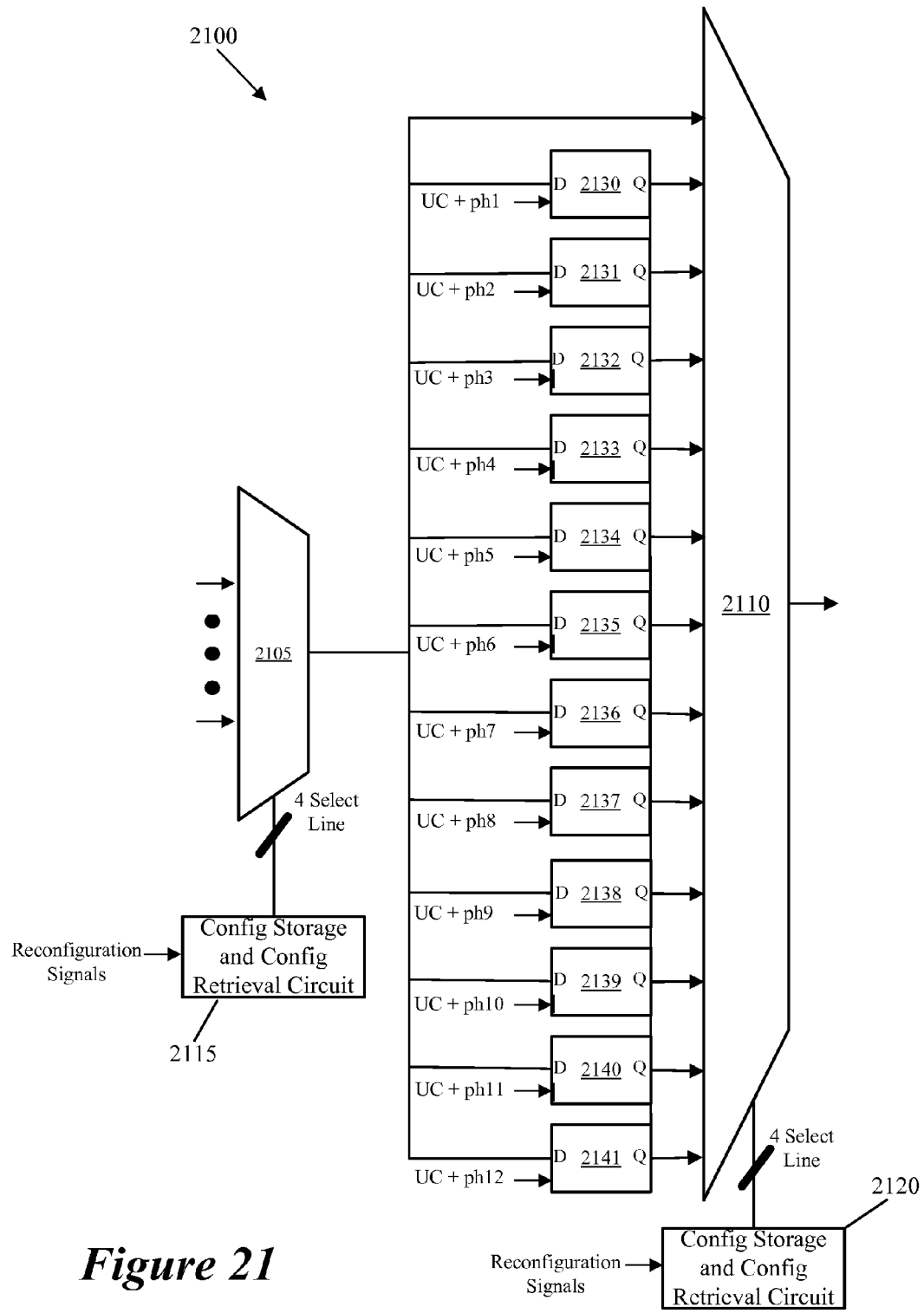
FIG. 21 illustrates an example of such a low power sub-cycle reconfigurable conduit, sometimes called an "Rcave".

FIG. 21 illustrates an example of such a low power sub-cycle reconfigurable conduit, sometimes called an "Rcave". As shown in this figure, the circuit 2100 includes a source multiplexer 2105, a destination multiplexer 2110, twelve registers 2130-2141, and two configuration storage and configuration retrieval circuits 2115 and 2120.

In some embodiments, the source multiplexer 2105 is a sixteen-to-one multiplexer that receives sixteen inputs and selects one of them to send to the registers 2130-2141 in every sub-cycle. The selection is based on a 4-bit select signal provided by the configuration storage and configuration retrieval circuit 2115. In some embodiments, the configuration storage and configuration retrieval circuit 2115 provides the 4-bit select signal according to the reconfiguration signals it receives at the rate of sub-cycle clock.

The twelve registers 2130-2141 of some embodiments are master-slave flip-flops. Each of the twelve registers 2130-2141 operates at the rate of the user clock, but at different phase. At each sub-cycle, one of the registers 2130-2141 is enabled by its clock signal to save the signal received from the source multiplexer 2105 and hold it for a duration equal to one user clock cycle before providing the signal to the destination multiplexer 2110. In some embodiments, the registers 2130-2141 rotate and take turns at every sub-cycle to save the signal coming from the source multiplexer 2105. The low power conduit 2100 of some embodiments allows the use of a user signal to enable the registers 2130-2141 so that each of the registers can hold a value for more than one user clock cycle.

In some embodiments, the destination multiplexer 2110 is a sixteen-to-one multiplexer that receives twelve of its inputs from the registers 2130-2141. The selection is based on a 4-bit select signal provided by the configuration storage and configuration retrieval circuit 2120. In some embodiments, the configuration storage and configuration retrieval circuit 2120 provides the 4-bit select signal according to the reconfiguration signals it receives at the rate of sub-cycle clock.

In some embodiments, the configuration data provided by the configuration storage and configuration retrieval circuits 2115 and 2120 comes at least partly from configuration data storage of the IC. In some embodiments, the data in the configuration data storage comes from memory devices of an electronic device on which the IC is a component. In some embodiments (e.g., some embodiments that are not runtime reconfigurable), the configuration data storages store one configuration data set (e.g., one bit or more than one bit) for all clock cycles. In other embodiments (e.g., embodiments that are runtime reconfigurable and have runtime reconfigurable circuits), the configuration data storages store multiple configuration data sets, with each set defining the operations of the multiplexers 2105 and 2110 during different clock cycles. These different clock cycles might be different user design clock cycles, or different sub-cycles of a user design clock cycle or some other clock cycle. In other words, the circuits 2105 and 2110 can be reconfigured to perform a different operation in every clock cycle of a set (e.g., 3 or more) of consecutive clock cycles.

In some embodiments, almost every multiplexer in the routing fabric is followed by a timing adjustment storage element. The low power sub-cycle reconfigurable conduit 2100 is also a timing adjustment storage element. A timing adjustment storage element allows time borrowing and ensures that time requirements are met. A timing adjustment storage element can also be used to handle clock skewing.

The low power sub-cycle reconfigurable conduit 2100 is a clocked storage element. Because a user clock cycle is much longer than a sub-cycle and a substantial portion of the components of the circuit 2100 operate at the rate of the user clock cycle, the low power sub-cycle reconfigurable conduit 2100 can efficiently hold a value for several sub-cycles while consuming very little power.

In some embodiments, there is a low power sub-cycle reconfigurable conduit 2100 for every physical LUT. So, almost all LUT outputs can be stored in a low power sub-cycle reconfigurable conduit while consuming little power and space. Since the low power sub-cycle reconfigurable conduit 2100 is placed throughout the routing fabric, a rich resource is available for implementing sub-cycle reconfigurable circuits at a very low cost.

The low power sub-cycle reconfigurable conduit 2100 can also provide an inexpensive way to do clock domain crossing in a sub-cycle reconfigurable environment. The low power sub-cycle reconfigurable conduit 2100 acts as the landing pad for the clock crossing and handles the clock synchronization. For example, a signal from clock domain A can be put into one of the registers 2130 and wait as many sub-cycles as needed to be synchronized with clock domain B before being outputted by the low power sub-cycle reconfigurable conduit 2100. Other types of low power sub-cycle reconfigurable conduits are described in U.S. Patent application 61/671,665, which is incorporated herein by reference.

In some embodiments, the number of phased user-cycle storage elements in a low power sub-cycle reconfigurable conduit is equal to the number of sub-cycles per user cycle (sometimes called the "looperness" of the circuit), and the number of inputs of the low power sub-cycle reconfigurable conduit is equal to the looperness plus one extra input for a direct connection between the source multiplexer and the destination multiplexer. In FIG. 21 the looperness of the circuit is 12, if the looperness determines the number of registers 2130-2141. The cost of the individual registers 2130-2141 of the low power sub-cycle reconfigurable conduit is zero because they act in a manner similar to conduits (such as conduit 730) with one input and one (delayed by a set number of sub-cycles) output. So, all the data that enters one through a register's physical input in one sub-cycle leaves it a set number of sub-cycles later. The cost for the source MUX 2105 is shown in eqs. (27A) and (27B).

$$\text{cost(source MUX)} = f_{2D}(\text{source MUX}) * (p-1)/p \quad (27A)$$

$$\text{cost(source MUX)} \approx f_{2D}(\text{source MUX}) \quad (27B)$$

The approximation of eq. (27B) is based on the fact that 15/16 is approximately 1. Similarly, the cost of the destination MUX 2110 is shown in eqs. (28A) and (28B).

$$\text{cost(destination MUX)} = f_{2D}(\text{source MUX}) * L/(L+1) \quad (28A)$$

$$\text{cost(destination MUX)} \approx f_{2D}(\text{source MUX}) \quad (28B)$$

In eq. (28A) the number of inputs of the destination matrix is assumed to be the looperness L+1. The approximation of eq. (28B) assumes that the looperness is a large number.

Therefore the total cost of a low power sub-cycle reconfigurable conduit (assuming the number of inputs in both MUXs is large) is approximately twice the flow through either of the MUXs, regardless of the number of sub-cycles that the low power sub-cycle reconfigurable conduit delays the data. This low cost reflects the fact that while one path is using one of the data registers 2130-2141, other paths can be using both the source and destination MUXs in conjunction with other of the registers 2130-2141.

F. Cost of a MUX with a Time Via

The above subsections detail the costs of various sets of components capable of storing data for a particular number of sub-cycles. Another way to store data for a set number of sub-cycles is to place a time via after a MUX.

Figure 22:
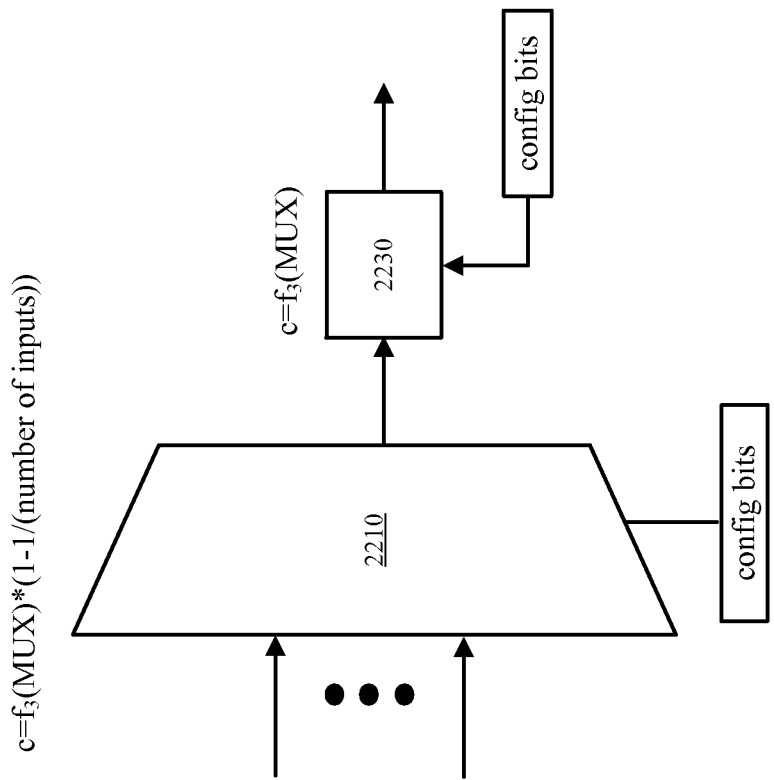
FIG. 22 illustrates a time via after a p-input MUX.

FIG. 22 illustrates a time via after a p-input MUX. The MUX 2210 receives data through its p inputs and sends data to time via 2230. The time via 2230 can store the data or send it on to the output of the time via. As previously described, the total data flow through a time via in some embodiments is calculated to be twice the flow into the time via through the physical input of the time via.

The flow into the time via 2230 is equal to the flow out of the MUX 2210. The total cost of the time via 2230 and MUX 2210 is the sum of their individual costs. Eqs. (29A)-(29B) show the total cost of the MUX 2210 and time via 2230.

$$\text{cost(total)} = \text{cost(MUX)} + \text{cost(time via)} \quad (29A)$$

$$\text{cost(total)} = f_{2D}(\text{MUX}) * (p-1)/p + f_{2D}(\text{time via})/2 \quad (29B)$$

$$\text{cost(total)} = f_{2D}(\text{MUX}) * (p-1)/p + 2 * f_{2D}(\text{MUX})/2 \quad (29C)$$

$$\text{cost(total)} = f_{2D}(\text{MUX}) * (p-1)/p + f_{2D}(\text{MUX}) \quad (29D)$$

$$\text{cost(total)} \approx 2 * f_{2D}(\text{MUX}) \quad (29E)$$

In going from eq. (29A) to eq. (29B), the cost for a time via is the cost shown in eq. (20). In going from eq. (29B) to eq. (29C) the flow within the time via 2230 in some embodiments is twice the flow into the time via 2230. In going from eq. (29D) to eq. (29E), the approximation assumes that the number of inputs, p, of the MUX 2210 is large.

In some embodiments, the cost $(2*f_{2D}(\text{MUX}))$ of the combined MUX 2210 and time via 2230 is a cost per sub-cycle that the time via 2230 stores data. That is, the cost for a path that uses the time via 2230 to store data for dt sub-cycles is as shown in eq. 30.

$$\text{cost} \approx 2 * f_{2D}(\text{MUX}) * (1+dt) \quad (30)$$

Eq. 30 reflects the fact that if data is stored for dt sub-cycles, the time via 2230 and MUX 2210 are both occupied (i.e., unusable for other paths) for dt+1 sub-cycles (including the sub-cycle in which the data is first received).

In other embodiments, the MUX 2210 is not considered occupied after the initial sub-cycle in which it supplies data to the time via 2230. In such embodiments, the cost for a path that uses the time via 2230 to store data for dt sub-cycles is as shown in eq. 31.

$$\text{cost} \approx f_{2D}(\text{MUX}) * (2+dt) \quad (31)$$

Eq. 31 reflects the fact that in such embodiments, the MUX 2210 costs only (approximately) the blocked flow through the MUX 2210 itself once, rather than the blocked flow through the MUX itself in each sub-cycle that the time via 2230 stores the data.

G. Comparison of Costs for Delaying Components

In the previous sections, there have been multiple different sets of components that can produce a time delay of a specified number of sub-cycles. Such sets of components are sometimes called "crossers". The costs of these crossers relative to the flow through the crossers and the delay in sub-cycles have been calculated above. In some embodiments, the relative costs of crossers at a given number of sub-cycles delays is used to determine which of several crossers should be used for a path. Table 1 shows the costs of each type of crosser relative to the flow through the crosser, for various delay times (dt).

TABLE 1

| dt | KMUX | Rcave | YMUX | TV1 | TV2 |
|---|---|---|---|---|---|
| 0 | 1.5 | 2 | 2 | 2 | 2 |
| 1 | 1.5 | 2 | 2.5 | 4 | 3 |
| 2 | 3 | 2 | 3 | 6 | 4 |
| 3 | 4.5 | 2 | 3.5 | 8 | 5 |
| 4 | 6 | 2 | 4 | 10 | 6 |
| 5 | 7.5 | 2 | 4.5 | 12 | 7 |

In table 1, TV1 represents the costs of a time via and an associated preceding MUX in embodiments that count the MUX as occupied while the time via is storing data. TV2 represents the costs of a time via and an associated preceding MUX in embodiments that do not count the MUX as occupied while the time via is storing data. According to Table 1, the KMUX blocks the least data flow for delays of 0 or 1 sub-cycle, while the Rcave blocks the least data flow for any longer delays.

H. Process for Defining Configurations

Figure 23:
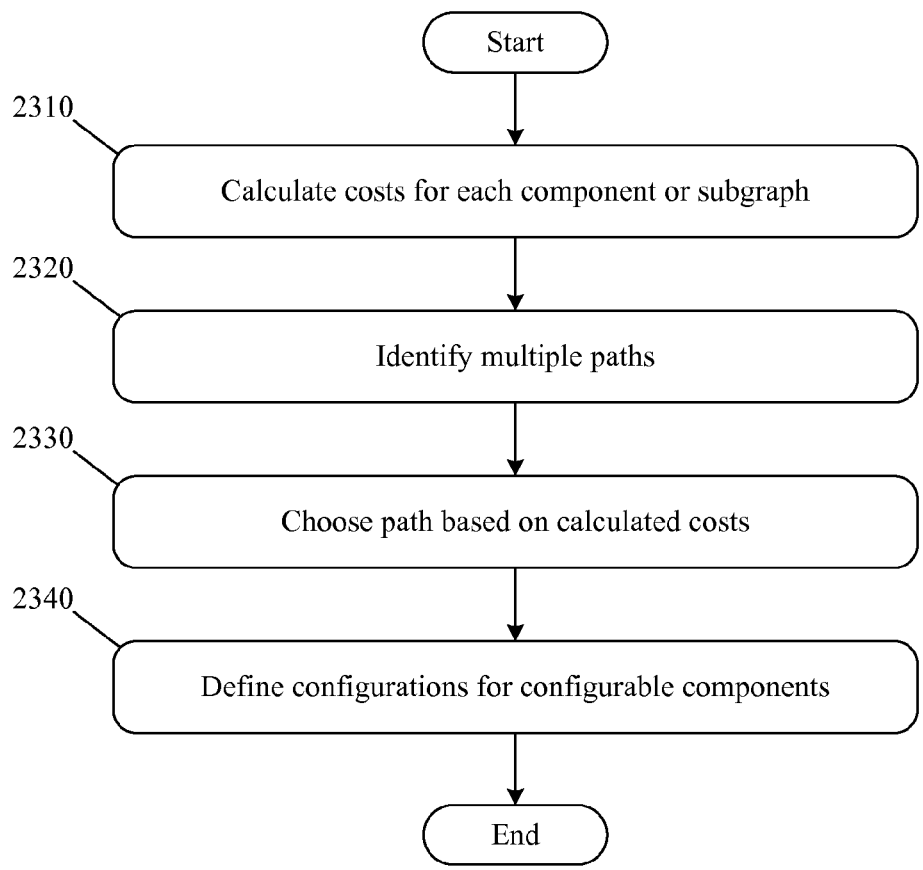
FIG. 23 conceptually illustrates a process of some embodiments for defining configurations based on calculated costs.

Some embodiments use a process that calculates costs and then defines configurations based on those costs. FIG. 23 conceptually illustrates a process 2300 of some embodiments for defining configurations based on calculated costs. The process calculates (at 2310) the costs for each component or subgraph. The process of some embodiments calculates these costs as described above in section IV.A-IV.F. The process 2300 then identifies (at 2320) multiple paths through the components of the IC that would each carry out a particular part of the user design. The process 2300 then chooses (at 2330) a path based on calculated costs of the components of that path. In some embodiments, operations 2320 and 2330 are replaced by a single operation that identifies individual components to use in a path, one at a time, out of a possible set of components that provide the next operation of the path that the user design calls for. For example, if the user design requires that data be carried from one already selected component to another component that has not been selected, with a delay of a particular number of sub-cycles, the process chooses the cheapest available set of delaying components.

After choosing a path, the process 2300 defines (at 2340) configurations for the configurable components of the path so that the components will act during runtime of the IC to produce the path.

V. Electronic System

Many of the above-described features and applications are implemented as software processes that are specified as a set of instructions recorded on a computer readable storage medium (also referred to as computer readable medium, machine readable medium, machine readable storage). When these instructions are executed by one or more computational or processing unit(s) (e.g., one or more processors, cores of processors, or other processing units), they cause the processing unit(s) to perform the actions indicated in the instructions. Examples of computer readable media include, but are not limited to, CD-ROMs, flash drives, random access memory (RAM) chips, hard drives, erasable programmable read only memories (EPROMs), electrically erasable programmable read-only memories (EEPROMs), etc. The computer readable media does not include carrier waves and electronic signals passing wirelessly or over wired connections.

In this specification, the term "software" is meant to include firmware residing in read-only memory or applications stored in magnetic storage which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention. In some embodiments, the software programs, when installed to operate on one or more electronic systems, define one or more specific machine implementations that execute and perform the operations of the software programs.

Figure 24:
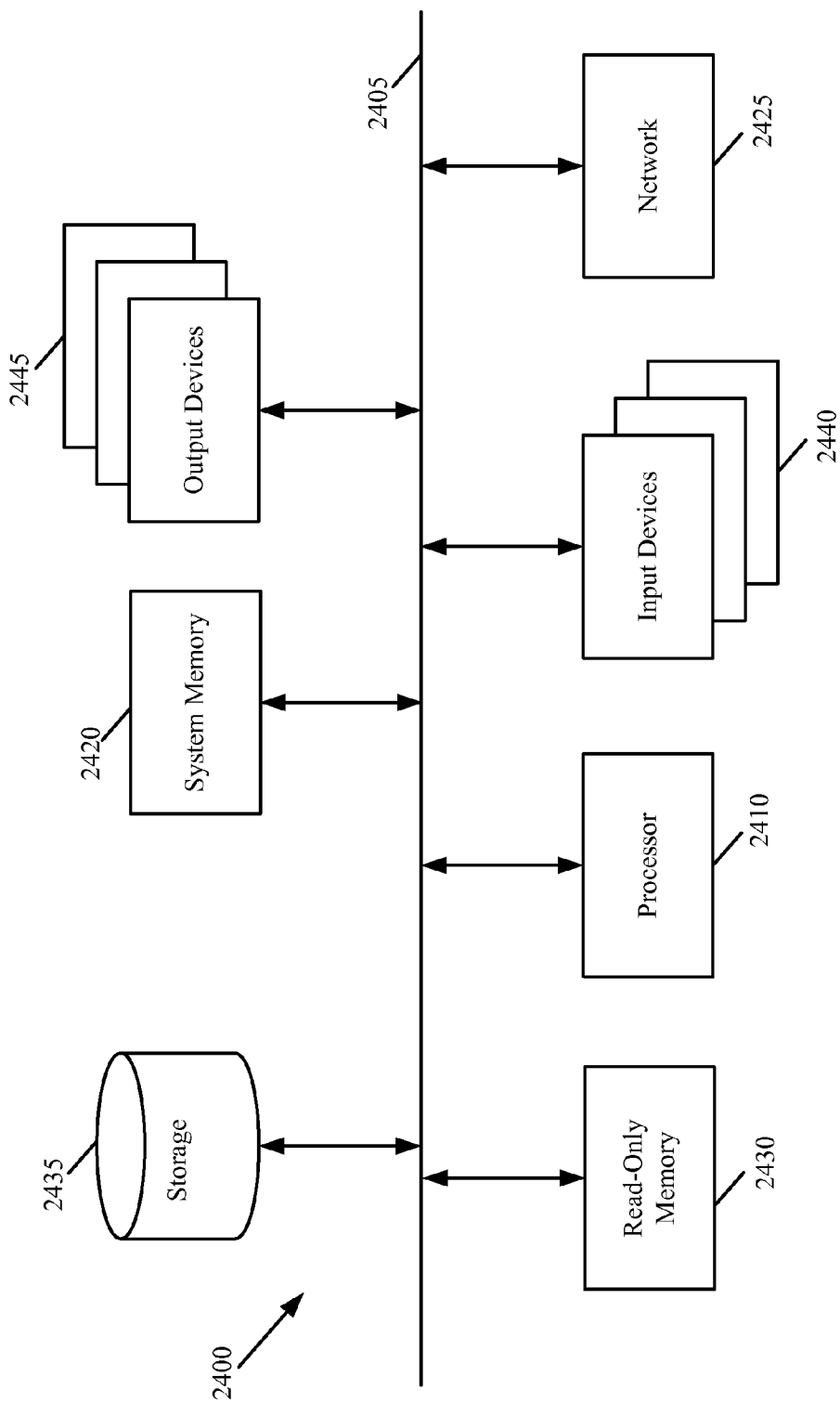
FIG. 24 conceptually illustrates an electronic system with which some embodiments of the invention are implemented.

FIG. 24 conceptually illustrates an electronic system 2400 with which some embodiments of the invention are implemented. The electronic system 2400 may be a computer (e.g., a desktop computer, personal computer, tablet computer, etc.), phone, PDA, or any other sort of electronic or computing device. Such an electronic system includes various types of computer readable media and interfaces for various other types of computer readable media. Electronic system 2400 includes a bus 2405, processing unit(s) 2410, a system memory 2420, a network 2425, a read-only memory 2430, a permanent storage device 2435, input devices 2440, and output devices 2445.

The bus 2405 collectively represents all system, peripheral, and chipset buses that communicatively connect the numerous internal devices of the electronic system 2400. For instance, the bus 2405 communicatively connects the processing unit(s) 2410 with the read-only memory 2430, the system memory 2420, and the permanent storage device 2435.

From these various memory units, the processing unit(s) 2410 retrieves instructions to execute and data to process in order to execute the processes of the invention. The processing unit(s) may be a single processor or a multi-core processor in different embodiments. The read-only-memory (ROM) 2430 stores static data and instructions that are needed by the processing unit(s) 2410 and other modules of the electronic system. The permanent storage device 2435, on the other hand, is a read-and-write memory device. This device is a non-volatile memory unit that stores instructions and data even when the electronic system 2400 is off. Some embodiments of the invention use a mass-storage device (such as a magnetic or optical disk and its corresponding disk drive) as the permanent storage device 2435.

Other embodiments use a removable storage device (such as a floppy disk, flash memory device, etc., and its corresponding disk drive) as the permanent storage device. Like the permanent storage device 2435, the system memory 2420 is a read-and-write memory device. However, unlike storage device 2435, the system memory 2420 is a volatile read-and-write memory, such a random access memory. The system memory 2420 stores some of the instructions and data that the processor needs at runtime. In some embodiments, the invention's processes are stored in the system memory 2420, the permanent storage device 2435, and/or the read-only memory 2430. For example, the various memory units include instructions for processing multimedia clips in accordance with some embodiments. From these various memory units, the processing unit(s) 2410 retrieves instructions to execute and data to process in order to execute the processes of some embodiments.

The bus 2405 also connects to the input and output devices 2440 and 2445. The input devices 2440 enable the user to communicate information and select commands to the electronic system. The input devices 2440 include alphanumeric keyboards and pointing devices (also called "cursor control devices"), cameras (e.g., webcams), microphones or similar devices for receiving voice commands, etc. The output devices 2445 display images generated by the electronic system or otherwise output data. The output devices 2445 include printers and display devices, such as cathode ray tubes (CRT) or liquid crystal displays (LCD), as well as speakers or similar audio output devices. Some embodiments include devices such as a touchscreen that function as both input and output devices.

Finally, as shown in FIG. 24, bus 2405 also couples electronic system 2400 to a network 2425 through a network adapter (not shown). In this manner, the computer can be a part of a network of computers (such as a local area network ("LAN"), a wide area network ("WAN"), or an Intranet, or a network of networks, such as the Internet. Any or all components of electronic system 2400 may be used in conjunction with the invention.

Some embodiments include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media may store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some embodiments are performed by one or more integrated circuits, such as application specific integrated circuits (ASICs) or field programmable gate arrays (FPGAs). In some embodiments, such integrated circuits execute instructions that are stored on the circuit itself. In addition, some embodiments execute software stored in programmable logic devices (PLDs), ROM, or RAM devices.

As used in this specification and any claims of this application, the terms "computer", "server", "processor", and "memory" all refer to electronic or other technological devices. These terms exclude people or groups of people. For the purposes of the specification, the terms display or displaying means displaying on an electronic device. As used in this specification and any claims of this application, the terms "computer readable medium," "computer readable media," and "machine readable medium" are entirely restricted to tangible, physical objects that store information in a form that is readable by a computer. These terms exclude any wireless signals, wired download signals, and any other ephemeral signals.

While the invention has been described with reference to numerous specific details, one of ordinary skill in the art will recognize that the invention can be embodied in other specific forms without departing from the spirit of the invention. In addition, a number of the figures (including FIGS. 6B, 11, 15, and 23) conceptually illustrate processes. The specific operations of these processes may not be performed in the exact order shown and described. The specific operations may not be performed in one continuous series of operations, and different specific operations may be performed in different embodiments. Furthermore, the process could be implemented using several sub-processes, or as part of a larger macro process. Thus, one of ordinary skill in the art would understand that the invention is not to be limited by the foregoing illustrative details, but rather is to be defined by the appended claims.

What is claimed is:

1. A method of defining a configuration for an integrated circuit (IC) with configurable circuits, the method comprising:
   determining a probabilistic flow of data through each of a plurality of components of the IC;
   identifying a first path of components and a second path of components in the IC;
   based on the probabilistic flow of data through the each component of the first path, identifying a cost of the first path;
   based on the probabilistic flow of data through each component of the second path, identifying a cost of the second path; and
   based on the identified costs of each of the paths, selecting, using a computer, one of the paths for the configuration.

2. The method of claim 1, wherein determining the probabilistic flow of data through a component of the IC comprises calculating a probabilistic flow of data through a particular input of the component, wherein the calculated probabilistic flow of data through the particular input of the component is an average flow of data through each of a set of inputs of the component.

3. The method of claim 2, wherein the average flow of data through each input of the set of inputs of the component is calculated based on a total number of physical inputs of the component and an additional temporal input of the component.

4. The method of claim 1 further comprising computing a first probabilistic flow value through a component based on physical inputs of the component and computing a second probabilistic flow value through the component based on at least one physical input of the component and at least one temporal input of the component.

5. The method of claim 4, wherein a component has a temporal input when the component is capable of storing data for a variable number of clock cycles.

6. The method of claim 1, wherein the paths use different components in different clock cycles of a plurality of clock cycles.

7. The method of claim 6, wherein the plurality of clock cycles are a plurality of sub-cycles of a longer user design clock cycle.

8. The method of claim 1, wherein the probabilistic flow of data through each of the plurality of components of the IC is calculated backward in run time and a probabilistic flow of data between components of a path is calculated from an input of one component in the path to an output of a previous component in the path.

9. The method of claim 1, wherein a component with only one input has zero cost.

10. The method of claim 9, wherein a component with only one physical input and a temporal input has a non-zero cost.

11. A non-transitory machine readable medium storing a program for defining a configuration for an integrated circuit (IC) with configurable circuits, the program comprising sets of instructions for:
  determining a probabilistic flow of data through each of a plurality of components of the IC;
  determining a cost for each of the plurality of components based on the probabilistic flow of data through the plurality of components;
  identifying, based on said costs, a cost of a first path of the components;
  identifying, based on said costs, a cost of a second path of the components; and
  selecting, based on the identified costs of each of the paths, one of the first path and the second path for the configuration.

12. The non-transitory machine readable medium of claim 11, determining the probabilistic flow of data through a component of the IC comprises calculating a probabilistic flow of data through a particular input of the component, wherein the calculated probabilistic flow of data through the particular input of the component is an average flow of data through a set of inputs of the component.

13. The non-transitory machine readable medium of claim 12, wherein the average flow of data through the set of inputs of the component is calculated based on a total number of physical inputs of the component and a total number of temporal inputs of the component.

14. The non-transitory machine readable medium of claim 11, wherein the program further comprises sets of instructions for computing a first probabilistic flow value through at least one component based on a total number of physical inputs of the component and computing a second flow through the component based on the total number of physical inputs of the component and a total number of temporal inputs of the component.

15. The non-transitory machine readable medium of claim 14, wherein a component has a temporal input when the component is capable of storing data for a variable number of clock cycles.

16. The non-transitory machine readable medium of claim 11, wherein the probabilistic flow of data through each of a plurality of components of the IC is calculated backward in run time and a probabilistic flow of data between components of a path is calculated from an input of one component in the path to an output of a previous component in the path.

17. The non-transitory machine readable medium of claim 11, wherein a component with only one input has zero cost.

18. The non-transitory machine readable medium of claim 17, wherein a component with only one physical input and a temporal input has a non-zero cost.

19. A method of designing a configuration for an integrated circuit (IC) with configurable circuits, the method comprising:
  determining a set of relationships between a plurality of components of the IC;
  identifying a steady state probabilistic flow of data through each of the plurality of components based on the determined set of relationships;
  identifying a cost for each component based on the identified steady state probabilistic flow of data through each component; and
  defining, a set of configurations for the IC based on the identified costs.

20. The method of claim 19, wherein the set of relationships between the plurality of components comprises a connection matrix for the plurality of components.

21. The method of claim 20 further comprising simplifying the connection matrix.

22. The method of claim 20 further comprising adjusting the connection matrix to simulate connections to re-circulate probabilistic flow that would leave the plurality of components without said adjustment.

* * * * *